(12) United States Patent
Makino et al.

(10) Patent No.: US 11,940,506 B2
(45) Date of Patent: *Mar. 26, 2024

(54) MAGNETIC SENSOR

(71) Applicant: TDK CORPORATION, Tokyo (JP)

(72) Inventors: Kenzo Makino, Tokyo (JP); Norikazu Ota, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/881,666

(22) Filed: Aug. 5, 2022

(65) Prior Publication Data

US 2022/0373620 A1 Nov. 24, 2022

Related U.S. Application Data

(63) Continuation of application No. 17/084,376, filed on Oct. 29, 2020, now Pat. No. 11,467,234.

(30) Foreign Application Priority Data

Nov. 27, 2019 (JP) .................. 2019-214275

(51) Int. Cl.
*G01R 33/09* (2006.01)
*H01C 7/00* (2006.01)
*H01F 7/20* (2006.01)

(52) U.S. Cl.
CPC ......... *G01R 33/098* (2013.01); *G01R 33/096* (2013.01); *H01F 7/20* (2013.01); *H01C 7/00* (2013.01)

(58) Field of Classification Search
CPC ....... G01R 33/098; G01R 33/096; H01F 7/20; H01C 7/00
See application file for complete search history.

(56) References Cited

U.S. PATENT DOCUMENTS

| 6,798,616 | B1 * | 9/2004 | Seagle ................. G11B 5/3903 |
| 9,594,130 | B2 | 3/2017 | Kawakami et al. |
| 2005/0270020 | A1 | 12/2005 | Peczalski et al. |
| 2008/0100290 | A1 | 5/2008 | Shoji |
| 2008/0106273 | A1 | 5/2008 | Bauer et al. |
| 2012/0151786 | A1 | 6/2012 | Ohmori et al. |
| 2013/0038323 | A1 | 2/2013 | Honkura et al. |

(Continued)

FOREIGN PATENT DOCUMENTS

| JP | 2001-133529 A | 5/2001 |
| JP | 2006-234615 A | 9/2006 |
| JP | 2008-111801 A | 5/2008 |

(Continued)

OTHER PUBLICATIONS

Translation of Nov. 2, 2021 Office Action issued in Japanese Patent Application No. 2019-214275.

*Primary Examiner* — Feba Pothen
(74) *Attorney, Agent, or Firm* — Oliff PLC

(57) ABSTRACT

A magnetic sensor includes at least one MR element and a coil. The coil includes at least one conductor portion. The at least one conductor portion is each located at a position such that a partial magnetic field generated by the conductor portion is applied to one of the at least one MR element, the one corresponding to the conductor portion, and extends along an imaginary curve curving to protrude in a direction away from the corresponding MR element.

15 Claims, 13 Drawing Sheets

(56) References Cited

U.S. PATENT DOCUMENTS

2013/0320972 A1 12/2013 Loreit et al.
2014/0266187 A1 9/2014 Mather

FOREIGN PATENT DOCUMENTS

| JP | 2008-180550 A | 8/2008 |
| JP | 2009-236803 A | 10/2009 |
| JP | 2017-072375 A | 4/2017 |
| JP | 2018-148189 A | 9/2018 |

* cited by examiner

MAGNETIC SENSOR

CROSS REFERENCE TO RELATED APPLICATION

This application is a continuation of U.S. application Ser. No. 17/084,376, filed Oct. 29, 2020, the contents of which are incorporated herein by reference.

BACKGROUND OF THE INVENTION

1. Field of the Invention

The present invention relates to a magnetic sensor including a magnetoresistive element and a coil that generates a coil magnetic field to be applied to the magnetoresistive element.

2. Description of the Related Art

Magnetic sensors have been used for a variety of applications. Examples of known magnetic sensors include one that uses a spin-valve magnetoresistive element provided on a substrate. The spin-valve magnetoresistive element includes a magnetization pinned layer having a magnetization whose direction is fixed, a free layer having a magnetization whose direction is variable depending on the direction of an applied magnetic field, and a gap layer located between the magnetization pinned layer and the free layer.

In a magnetic sensor using a magnetoresistive element, the magnetoresistive element desirably operates in its linear region. The linear region of the magnetoresistive element refers to a region where the resistance of the magnetoresistive element changes linearly or substantially linearly with a change in a magnetic field applied to the magnetoresistive element in a characteristic chart showing a relationship between the applied magnetic field and the resistance of the magnetoresistive element. Examples of known methods for adjusting the operating region of the magnetoresistive element to enable operation in the linear region include giving the free layer of the magnetoresistive element uniaxial magnetic anisotropy such as shape magnetic anisotropy.

If a magnetoresistive element includes a free layer having shape magnetic anisotropy, the direction of the magnetization of the free layer in the absence of an applied magnetic field is set to one of two mutually opposite directions parallel to the axis of easy magnetization of the free layer. However, the magnetization of the free layer of the magnetoresistive element can be reversed by application of a disturbance magnetic field, etc. For example, a magnetic sensor using the magnetoresistive element can produce a detection value different from the original value once the magnetization of the free layer is reversed. An example of a method for aligning the direction of the magnetization of the free layer in the absence of an applied magnetic field to an original set direction is to apply a magnetic field to the magnetoresistive element from outside.

JP 2017-72375 A describes a magnetic sensor in which a magnetoresistive element is integrated with a coil. The coil of the magnetic sensor generates a bias magnetic field to be applied to the free layer of the magnetoresistive element. The bias magnetic field can align the direction of the magnetization of the free layer in the absence of an applied magnetic field to the direction of the bias magnetic field. In addition, if the direction of the magnetization of the free layer in the absence of an applied magnetic field deviates from the original set direction, the magnetic sensor can generate the bias magnetic field to reset the direction of the magnetization of the free layer.

To align the direction of the magnetization of the free layer in the absence of an applied magnetic field or reset the direction of the magnetization of the free layer by the magnetic field generated by the coil, a sufficient amount of current needs to be passed through the coil. However, in a magnetic sensor in which a magnetoresistive element is integrated with a coil, like the magnetic sensor described in JP 2017-72375 A in particular, a sufficient amount of current is not always able to be passed through the coil. As a result, there have been cases where a magnetic field of sufficient strength cannot be applied to the free layer.

SUMMARY OF THE INVENTION

An object of the present invention is to provide a magnetic sensor that can apply a magnetic field of sufficient strength to a magnetoresistive element by using a coil.

A magnetic sensor according to the present invention includes at least one magnetoresistive element whose resistance changes with an external magnetic field, and a coil that generates a coil magnetic field, the coil magnetic field being a magnetic field to be applied to the at least one magnetoresistive element. The coil includes at least one conductor portion. The coil magnetic field includes a partial magnetic field generated by each of the at least one conductor portion. The at least one conductor portion is each located at a position such that the partial magnetic field generated by the conductor portion is applied to one of the at least one magnetoresistive element, the one corresponding to the conductor portion, and extends along an imaginary curve curving to protrude in a direction away from the corresponding magnetoresistive element.

The magnetic sensor according to the present invention may further include a support member that supports the at least one magnetoresistive element. The support member includes a top surface opposed to the at least one magnetoresistive element, and a bottom surface located on a side opposite to the top surface. The top surface of the support member may include a curved surface portion curving to protrude in a direction away from the bottom surface of the support member. The at least one magnetoresistive element may be located on the curved surface portion. The at least one magnetoresistive element each also includes a bottom surface opposed to the support member. The bottom surface of each of the at least one magnetoresistive element may be a curved surface curving along the curved surface portion.

If the top surface of the support member includes the curved surface portion, the curved surface portion may include a center portion that extends along a first direction and is located at a center of the curved surface portion in a second direction orthogonal to the first direction, and a first side portion and a second side portion that are located on both sides of the center portion in the second direction. In such a case, the first and second side portions may be two curved slopes that are located at positions closer to the bottom surface of the support member than the center portion is, and a distance between which increases toward the bottom surface of the support member. The at least one magnetoresistive element may be located on the first side portion. Alternatively, the at least one magnetoresistive element may include at least one first magnetoresistive element located on the first side portion and at least one second magnetoresistive element located on the second side portion.

If the magnetic sensor according to the present invention includes the support member, the at least one conductor portion may be located at a position to sandwich the at least one magnetoresistive element with the support member. In such a case, the magnetic sensor may further include an insulating layer that covers the at least one magnetoresistive element and the top surface of the support member. The at least one conductor portion may be located on the insulating layer. In such a case, the at least one magnetoresistive element may each also include a stack of a plurality of layers. The at least one conductor portion may each extend in part in parallel with surfaces of the layers constituting one of the at least one magnetoresistive element, the one corresponding to the conductor portion. Alternatively, the at least one conductor portion may each extended not in parallel with surfaces of the layers constituting one of the at least one magnet element, the one corresponding to the conductor portion.

If the at least one conductor portion is located at the position to sandwich the at least one magnetoresistive element with the support member, the coil may further include at least one second conductor portion. The at least one second conductor portion is a different part of the coil from the at least one conductor portion. In such a case, the coil magnetic field may further include a second partial magnetic field generated by each of the at least one second conductor portion. The at least one second conductor portion may be located on the bottom surface side of the support member. The at least one second conductor portion may be each located at a position such that the second partial magnetic field generated by the second conductor portion is applied to one of the at least one magnetoresistive element, the one corresponding to the second conductor portion.

If the coil includes the at least one second conductor portion, the at least one magnetoresistive element may each include a stack of a plurality of layers. The at least one conductor portion may each extend in part in parallel with surfaces of the layers constituting one of the at least one magnetoresistive element, the one corresponding to the conductor portion. The at least one second conductor portion may each extend not in parallel with surfaces of the layers constituting one of the at least one magnetoresistive element, the one corresponding to the second conductor portion. Alternatively, the at least one conductor portion may each extend not in parallel with surfaces of the layers constituting one of the at least one magnetoresistive element, the one corresponding to the conductor portion. The at least one second conductor portion may each extend in part in parallel with surfaces of the layers constituting one of the at least one magnetoresistive element, the one corresponding to the second conductor portion.

In the magnetic sensor of the present invention, the at least one magnetoresistive element may each include a magnetization pinned layer having first magnetization whose direction is fixed and a free layer having second magnetization whose direction is changeable with the external magnetic field. The coil magnetic field may be intended to orient the direction of the second magnetization of the free layer to a predetermined direction.

In the magnetic sensor of the present invention, the at least one conductor portion that is a part of the coil is each located at a position such that the partial magnetic field generated by the conductor portion is applied to one of the at least one magnetoresistive element, the one corresponding to the conductor portion, and extends along an imaginary curve curving to protrude in a direction away from the corresponding magnetoresistive element. According to the present invention, a magnetic field of sufficient strength can thus be applied to the magnetoresistive element by the coil.

Other and further objects, features and advantages of the present invention will appear more fully from the following description.

DETAILED DESCRIPTION OF THE PREFERRED EMBODIMENTS

First Embodiment

Preferred embodiments of the present invention will now be described in detail with reference to the drawings. An outline of a magnetic sensor system including a magnetic sensor according to a first embodiment of the present invention will initially be described with reference to FIG. 1. A magnetic sensor system 100 according to the present embodiment includes a magnetic sensor 1 according to the present embodiment and a magnetic field generator 5. The magnetic field generator 5 generates a target magnetic field MF that is a magnetic field for the magnetic sensor 1 to detect (magnetic field to be detected).

The magnetic field generator 5 is rotatable about a rotation axis C. The magnetic field generator 5 includes a pair of magnets 6A and 6B. The magnets 6A and 6B are arranged at symmetrical positions with a virtual plane including the rotation axis C at the center. The magnets 6A and 6B each have an N pole and an S pole. The magnets 6A and 6B are located in an orientation such that the N pole of the magnet 6A is opposed to the S pole of the magnet 6B. The magnetic field generator 5 generates the target magnetic field MF in the direction from the N pole of the magnet 6A to the S pole of the magnet 6B.

The magnetic sensor 1 is located at a position where the target magnetic field MF at a predetermined reference position can be detected. The reference position may be located on a rotation axis C. In the following description, the reference position is located on the rotation axis C. The magnetic sensor 1 detects the target magnetic field MF generated by the magnetic field generator 5, and generates a detection value Vs. The detection value Vs has a correspondence with a relative position, or rotational position in particular, of the magnetic field generator 5 with respect to the magnetic sensor 1.

Figure 1:
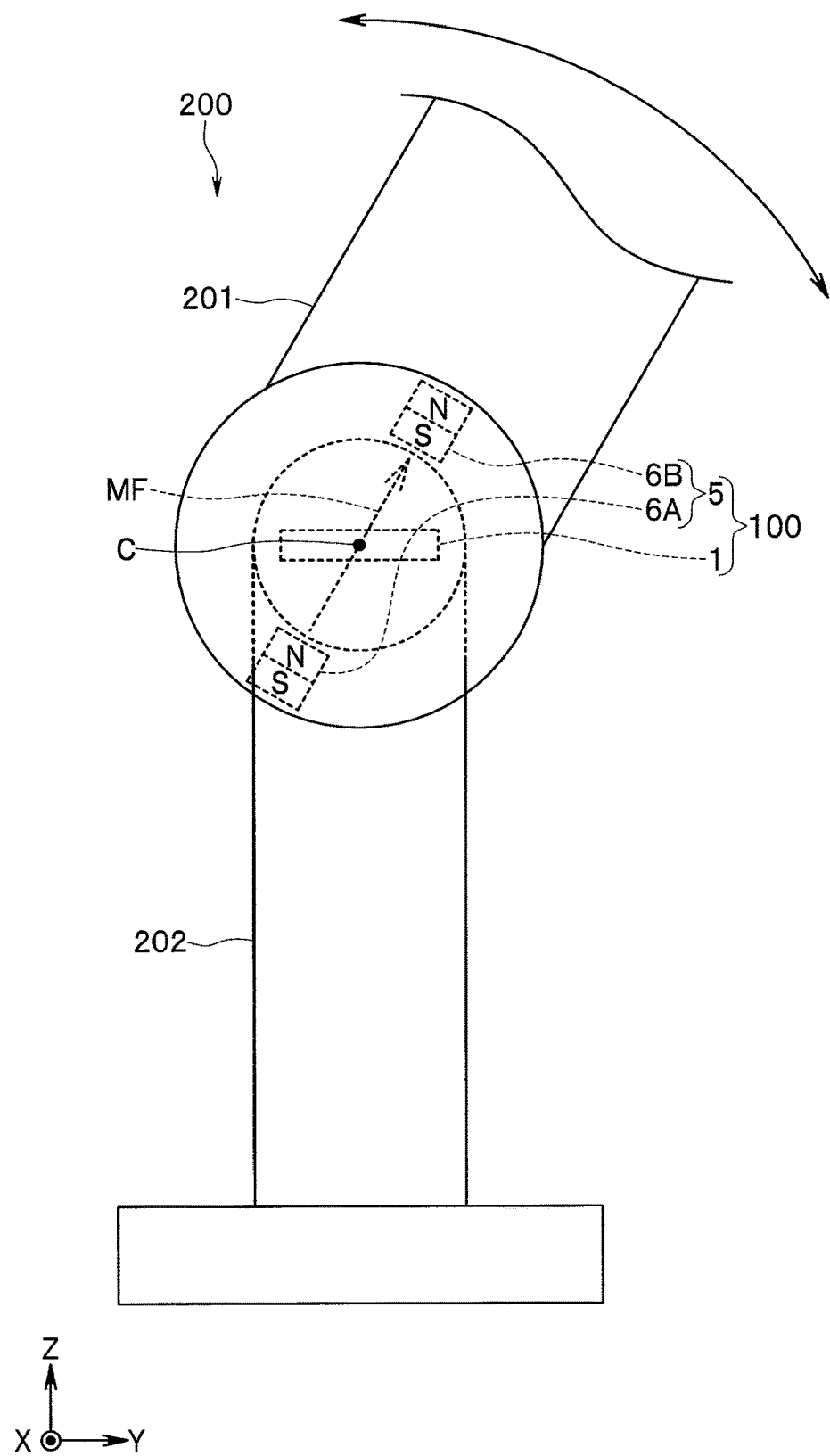
FIG. 1 is an explanatory diagram showing a schematic configuration of a magnetic sensor system of a first embodiment of the invention.

The magnetic sensor system 100 can be used as a device for detecting the rotational position of a rotatable moving part in an apparatus that includes the moving part. Examples of such an apparatus include a joint of an industrial robot. FIG. 1 shows an example where the magnetic sensor system 100 is applied to an industrial robot 200.

The industrial robot 200 shown in FIG. 1 includes a moving part 201 and a support unit 202 that rotatably supports the moving part 201. The moving part 201 and the support unit 202 are connected at a joint. The moving part 201 rotates about the rotation axis C. For example, if the magnetic sensor system 100 is applied to the joint of the industrial robot 200, the magnetic sensor 1 may be fixed to the support unit 202, and the magnets 6A and 6B may be fixed to the moving part 201.

Now, we define X, Y, and Z directions as shown in FIG. 1. The X, Y, and Z directions are orthogonal to one another. In the present embodiment, a direction parallel to the rotation axis C (in FIG. 1, a direction out of the plane of the drawing) will be referred to as the X direction. In FIG. 1, the Y direction is shown as a rightward direction, and the Z direction is shown as an upward direction. The opposite directions to the X, Y, and Z directions will be referred to as −X, −Y, and −Z directions, respectively. The direction of the target magnetic field MF rotates within the YZ plane, about the reference position on the rotation axis C.

Figure 2:
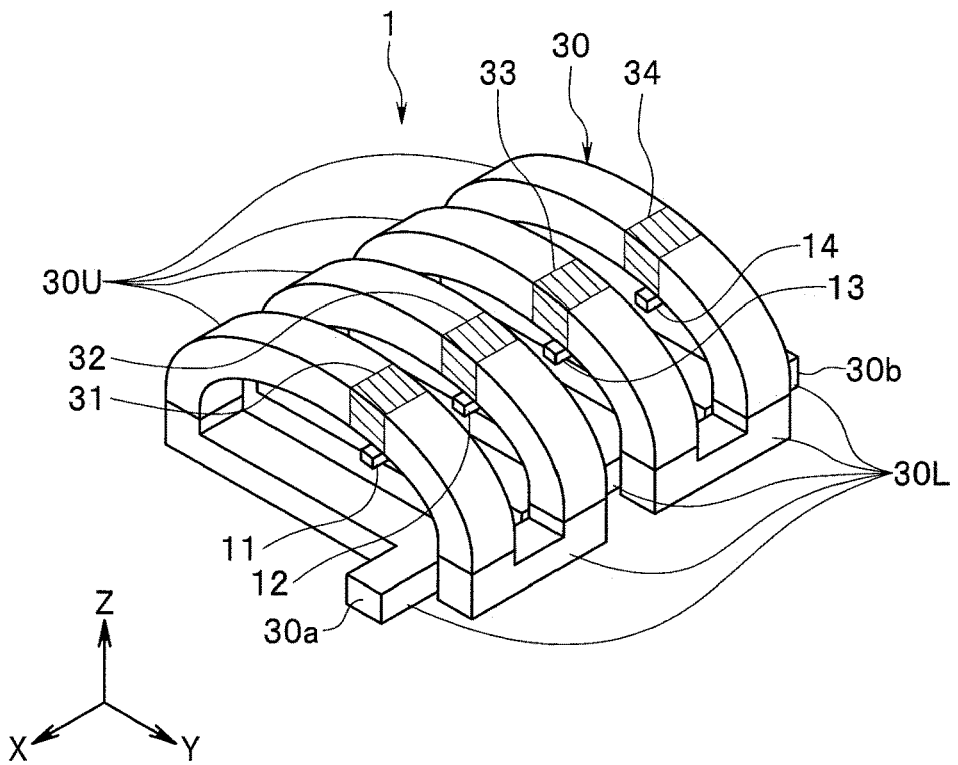
FIG. 2 is a perspective view showing magnetoresistive elements and a coil of a magnetic sensor according to the first embodiment of the invention.
Figure 3:
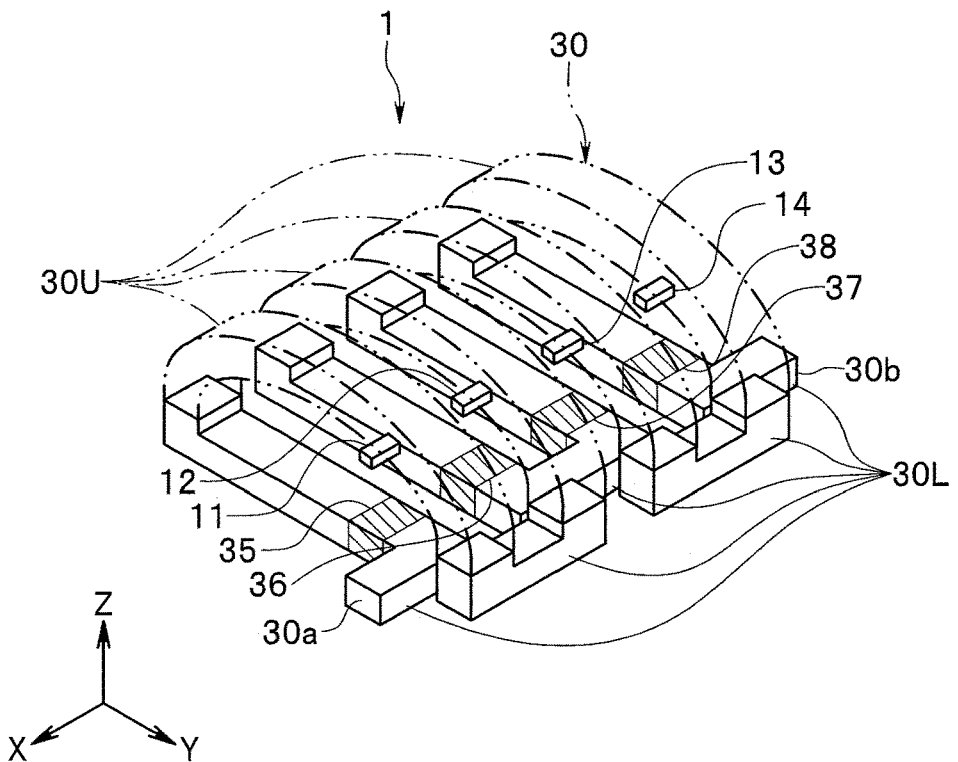
FIG. 3 is a perspective view showing the magnetoresistive elements and the coil of the magnetic sensor according to the first embodiment of the invention.
Figure 4:
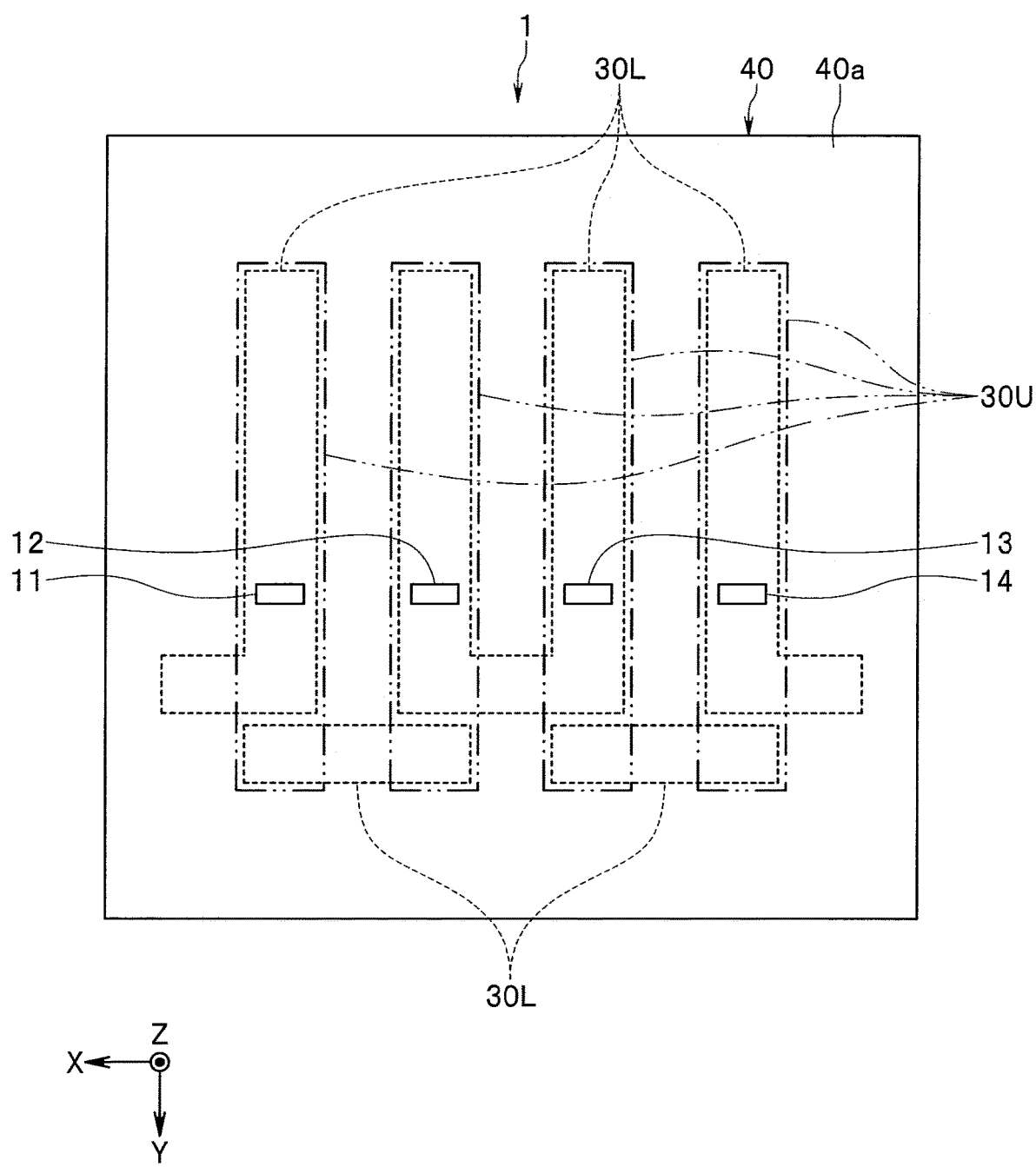
FIG. 4 is a plan view showing a magnetic sensor according to the first embodiment of the invention.
Figure 5:
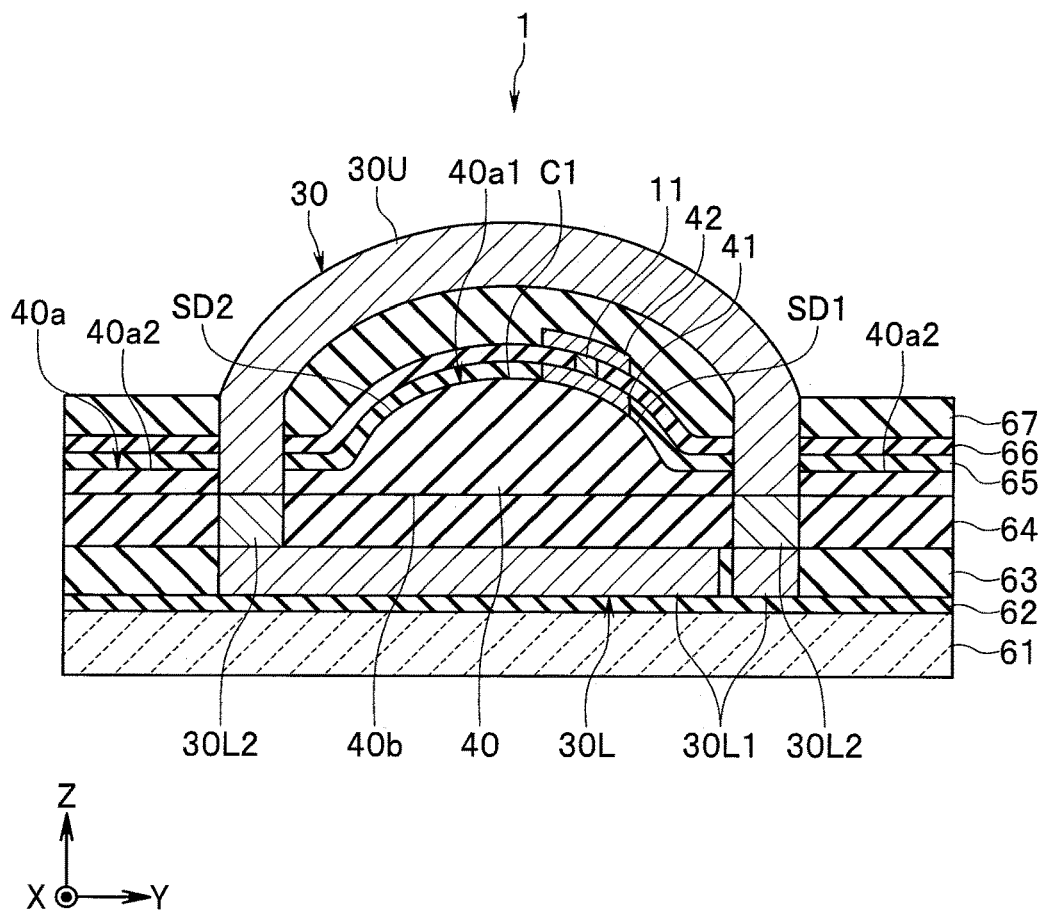
FIG. 5 is a sectional view showing a cross section of the magnetic sensor according to the first embodiment of the invention.
Figure 6:
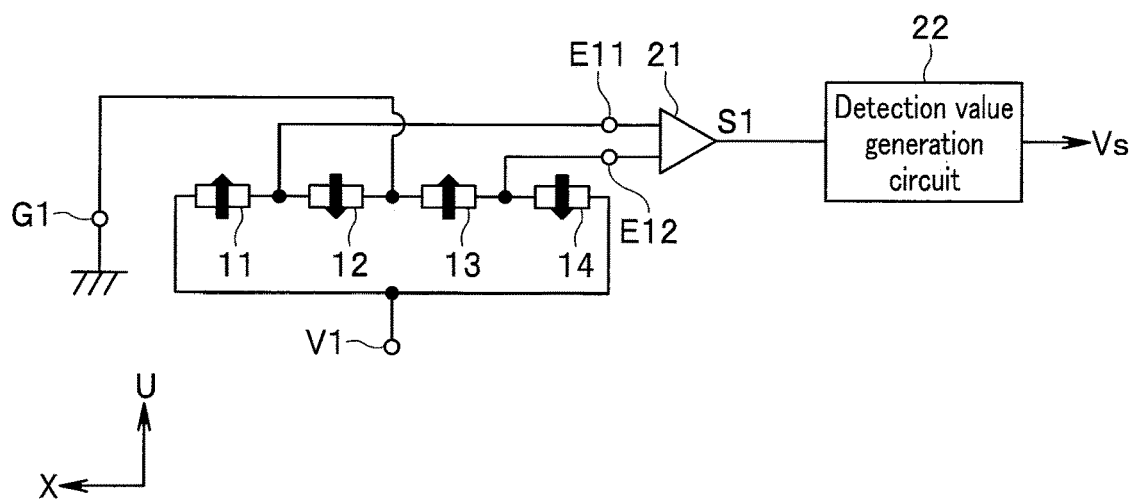
FIG. 6 is a circuit diagram showing the circuit configuration of the magnetic sensor according to the first embodiment of the invention.

Next, a configuration of the magnetic sensor 1 according to the present embodiment will be described with reference to FIGS. 2 to 6. FIGS. 2 and 3 is a perspective view showing magnetoresistive elements and a coil of the magnetic sensor 1. FIG. 4 is a plan view showing the magnetic sensor 1. FIG. 5 is a sectional view showing a cross section of the magnetic sensor 1. FIG. 6 is a circuit diagram showing the circuit configuration of the magnetic sensor 1.

The magnetic sensor 1 includes at least one magnetoresistive element whose resistance changes with an external magnetic field, and a support member 40 that supports the at least one magnetoresistive element. A magnetoresistive element will hereinafter be referred to as an MR element. The at least one MR element is each configured to be able to detect the target magnetic field MF. In the present embodiment, the magnetic sensor 1 includes four MR elements 11, 12, 13, and 14 as the at least one MR element. FIG. 5 shows a cross section of the magnetic sensor 1, intersecting the MR element 11.

For example, the support member 40 includes an insulating layer made of an insulating material such as $SiO_2$. As shown in FIG. 5, the support member 40 includes a top surface 40a opposed to the MR elements 11 to 14, and a bottom surface 40b located on a side opposite to the top surface 40a. The top surface 40a is located at an end of the support member 40 in the Z direction. The bottom surface 40b is located at an end of the support member 40 in the −Z direction. The bottom surface 40b is parallel to the XY plane.

The top surface 40a of the support member 40 includes a curved surface portion 40a1 and a flat surface portion 40a2. The curved surface portion 40a1 curves to protrude in a direction away from the bottom surface 40b of the support member 40 (Z direction). The flat surface portion 40a2 is located at a position closer to the bottom surface 40b than the curved surface portion 40a1 is. The flat surface portion 40a2 may be parallel to the XY plane.

A direction parallel to the X direction will be referred to as a first direction, and a direction parallel to the Y direction a second direction. The first and second directions are each defined to include one specific direction and a direction opposite to the one specific direction. The curved surface portion 40a1 includes a center portion C1, a first side portion SD1, and a second side portion SD2. The center portion C1 extends along the first direction and is located at the center of the curved surface portion 40a1 in the second direction. The first and second side portions SD1 and SD2 are located on both sides of the center portion C1 in the second direction. The first and second side portions SD1 and SD2 are located at positions closer to the bottom surface 40b of the support member 40 than the center portion C1 is. The first and second side portions SD1 and SD2 are two curved slopes a distance between which increases toward the bottom surface 40b of the support member 40. The first and second side portions SD1 and SD2 have a symmetrical or substantially symmetrical shape with respect to the XZ plane intersecting the center of the curved surface portion 40a1 in the second direction.

The support member 40 has a cross-sectional shape such that the curved surface portion 40a1 is formed on the top surface 40a. Specifically, the support member 40 has a cross-sectional shape of bulging out in the Z direction in a given cross section parallel to the YZ plane.

The MR elements 11 to 14 are located on the curved surface portion 40a1. In particular, in the present embodiment, the MR elements 11 to 14 are all located on the first side portion SD1 of the curved surface portion 40a1. Lower electrodes to be described later are interposed between the MR elements 11 to 14 and the support member 40. As shown in FIGS. 2 to 4, the MR elements 11 to 14 are arranged in a row in this order along the −X direction.

The MR elements 11 to 14 each have a bottom surface opposed to the support member 40. The bottom surfaces of the MR elements 11 to 14 are curved surfaces curved along the curved surface portion 40a1.

As will be described later, the MR elements 11 to 14 each include a stack of a plurality of layers. Assuming that the layers have flat surfaces, the MR elements 11 to 14 are each located on the first side portion SD1 in an orientation such that the surfaces of the layers are oblique to the XY plane.

The magnetic sensor 1 further includes a coil 30 that generates a coil magnetic field which is a magnetic field to be applied to the at least one MR element, i.e., the MR elements 11 to 14. The MR elements 11 to 14 are integrated with the coil 30.

The coil 30 includes a first end 30a and a second end 30b located at both longitudinal ends of the conductor constituting the coil 30. The first and second ends 30a and 30b are connected to a not-shown power supply. The coil 30 is wound around the MR elements 11 to 14. In particular, in the present embodiment, the coil 30 is wound so that a coil magnetic field in the X or −X direction is applied to each of the MR elements 11 to 14. For example, if a current is passed in a direction from the first end 30a to the second end 30b, a coil magnetic field in the −X direction is applied to the MR elements 11 and 13, and a coil magnetic field in the X direction is applied to the MR elements 12 and 14. If a current is passed in a direction from the second end 30b to the first end 30a, a coil magnetic field in the X direction is applied to the MR elements 11 and 13, and a coil magnetic field in the −X direction is applied to the MR elements 12 and 14.

The coil 30 includes upper coil portions 30U located on the Z direction side with respect to the bottom surface 40b of the support member 40, and lower coil members 30L located on the −Z direction side with respect to the bottom surface 40b of the support member 40. In FIGS. 3 and 4, the upper coil portions 30U are shown by double-dotted dashed lines. In FIG. 4, the bottom coil portions 30L are shown by broken lines.

The magnetic sensor 1 further includes a plurality of lower electrodes 41 and a plurality of upper electrodes 42 that electrically connect the MR elements 11 to 14, a substrate 61, and insulating layers 62, 63, 64, 65, 66, and 67. The insulating layer 62 is located on the substrate 61. The lower coil portions 30L include a plurality of first layers 30L1 located on the insulating layer 62, and a plurality of second layers 30L2 located on the plurality of first layers 30L1. The insulating layer 63 is located on the insulating layer 62, around the plurality of first layers 30L 1. The insulating layer 64 is located on the first layers 30L1 and the insulating layer 63, around the second layers 30L2. The support member 40 is located on the second layers 30L2 and the insulating layer 64.

The plurality of lower electrodes 41 are located on the top surface 40a of the support member 40. The plurality of lower electrodes 41 on the top surface 40a of the support member 40 are mainly located on the first side portion SD1 of the curved surface portion 40a1. The insulating layer 65 is located on the top surface 40a of the support member 40, around the plurality of lower electrodes 41. The MR elements 11 to 14 are located on the plurality of lower electrodes 41. The insulating layer 66 is located on the plurality of lower electrodes 41 and the insulating layer 65, around the MR elements 11 to 14. The plurality of upper electrodes 42 are located on the MR elements 11 to 14 and the insulating layer 66. The insulating layer 67 is located on the plurality of upper electrodes 42 and the insulating layer 66. In FIG. 4, the plurality of lower electrodes 41, the plurality of upper electrodes 42, and the insulating layers 65 to 67 are omitted.

The upper coil portions 30U are mainly located on the insulating layer 67. The magnetic sensor 1 has a plurality of through holes running through from the top surface of the insulating layer 67 to the bottom surface 40b of the support member 40. The upper coil portions 30U and the lower coil portions 30L are connected to each other via the plurality of through holes.

The plurality of lower electrodes 41 and the plurality of upper electrodes 42 are made of a conductive material such as Cu. The substrate 61 is a semiconductor substrate made of a semiconductor such as Si, for example. The insulating layers 62 to 67 are made of an insulating material such as $SiO_2$, for example.

The magnetic sensor 1 further includes a not-shown insulating layer covering the upper coil portions 30U and the insulating layer 67. The not-shown insulating layer is made of an insulating material such as $SiO_2$, for example.

Note that the second layers 30L2 of the lower coil portions 30L and the insulating layer 64 may be omitted. In such a case, the support member 40 is located on the first layers 30L1 of the lower coil portions 30L and the insulating layer 63.

As shown in FIG. 6, the magnetic sensor 1 further includes a power supply node V1, a ground node G1, two signal output nodes E11 and E12, and a differential detector 21. The MR element 11 is arranged between the power supply node V1 and the signal output node E11. The MR element 12 is arranged between the signal output node E11 and the ground node G1. The MR element 13 is arranged between the signal output node E12 and the ground node G1. The MR element 14 is arranged between the power supply node V1 and the signal output node E12. A predetermined magnitude of power supply voltage is applied to the power supply node V1. The ground node G1 is grounded. The differential detector 21 outputs a signal corresponding to a potential difference between the signal output nodes E11 and E12 as the first detection signal S1.

The magnetic sensor 1 further includes a detection value generation circuit 22 that generates the detection value Vs on the basis of the detection signal S1. The detection value Vs depends on the detection signal S1. The detection value generation circuit 22 includes an application specific integrated circuit (ASIC) or a microcomputer, for example. A method for generating the detection value Vs will be described later.

Figure 7:
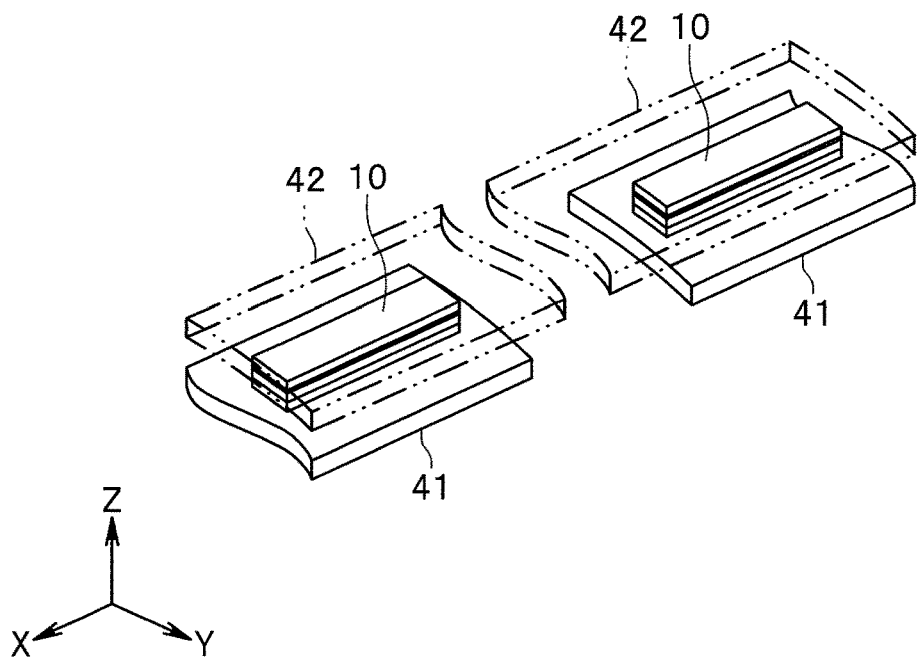
FIG. 7 is a perspective view showing the magnetoresistive elements, lower electrodes and upper electrodes of the first embodiment of the invention.
Figure 8:
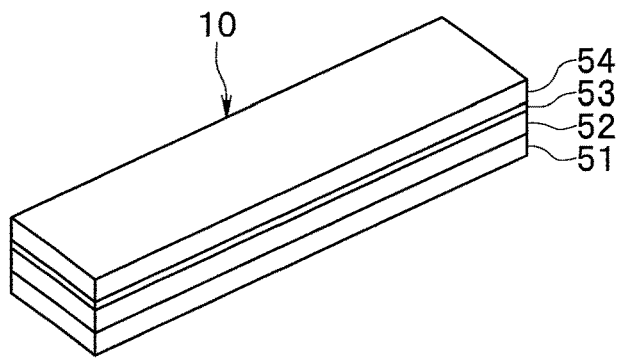
FIG. 8 is a perspective view showing the magnetoresistive element of the first embodiment of the invention.

The configuration of the MR elements 11 to 14 will now be described in detail. In describing any one of the MR elements 11 to 14, the MR element will hereinafter be denoted by the reference numeral 10. FIG. 7 is a perspective view showing the MR elements 10, the lower electrodes 41 and the upper electrodes 42. FIG. 8 is a perspective view showing the MR element 10.

In particular, in the present embodiment, the MR element 10 is a spin valve MR element. As shown in FIG. 8, the MR element 10 includes a magnetization pinned layer 52 having a magnetization whose direction is fixed, a free layer 54 having a magnetization whose direction is variable depending on the direction of an external magnetic field, and a gap layer 53 located between the magnetization pinned layer 52 and the free layer 54. The MR element 10 may be a tunneling magnetoresistive (TMR) element or a giant magnetoresistive (GMR) element. In the TMR element, the gap layer 53 is a tunnel barrier layer. In the GMR element, the gap layer 53 is a nonmagnetic conductive layer. The resistance of the MR element 10 changes with an angle that the direction of the magnetization of the free layer 54 forms with respect to the direction of the magnetization of the magnetization pinned layer 52. The resistance is minimized if the angle is 0°. The resistance is maximized if the angle is 180°. In the MR element 10, the free layer 54 has a shape anisotropy that sets the direction of the magnetization easy axis to be orthogonal to the magnetization direction of the magnetization pinned layer 52.

Each of the lower electrodes 41 has a long slender shape. Every two lower electrodes 41 adjacent to each other in the longitudinal direction of the lower electrodes 41 have a gap therebetween. As shown in FIG. 7, the MR element 10 is provided on the top surface of the lower electrode 41, near one end in the longitudinal direction. As shown in FIG. 8, the MR element 10 further includes an antiferromagnetic layer 51. The antiferromagnetic layer 51, the magnetization pinned layer 52, the gap layer 53, and the free layer 54 are stacked in this order, from closest to farthest, from the lower electrode 41. The antiferromagnetic layer 51 is electrically connected to the lower electrode 41. The antiferromagnetic layer 51 is made of an antiferromagnetic material. The antiferromagnetic layer 51 is in exchange coupling with the magnetization pinned layer 52 so as to pin the magnetization direction of the magnetization pinned layer 52.

Each of the upper electrodes 42 has a long slender shape, and establishes electrical connection between the respective free layers 54 of two adjacent MR elements 10 that are arranged on two lower electrodes 41 adjacent in the longitudinal direction of the lower electrodes 41. It should be appreciated that the layers 51 to 54 of the MR element 10 may be stacked in an order reverse to that shown in FIG. 8.

Next, a method for generating the detection value Vs will be described. Assuming that the surfaces of the layers constituting the MR elements 10 are flat surfaces, one direction parallel to the surfaces of the layers and orthogonal to the X direction will be referred to as a U direction. The direction opposite to the U direction will be referred to as a −U direction. Assuming that the surfaces of the layers are flat surfaces as described above, the MR elements 10 are located on the first side portion SD1 in an orientation such that the surfaces of the layers are oblique to the XY plane. This makes the U direction different from the Y or −Y direction. In the present embodiment, the U direction is a direction rotated from the −Y direction toward the Z direction by α. α is an angle of greater than 0° and smaller than 90°.

Figure 9:
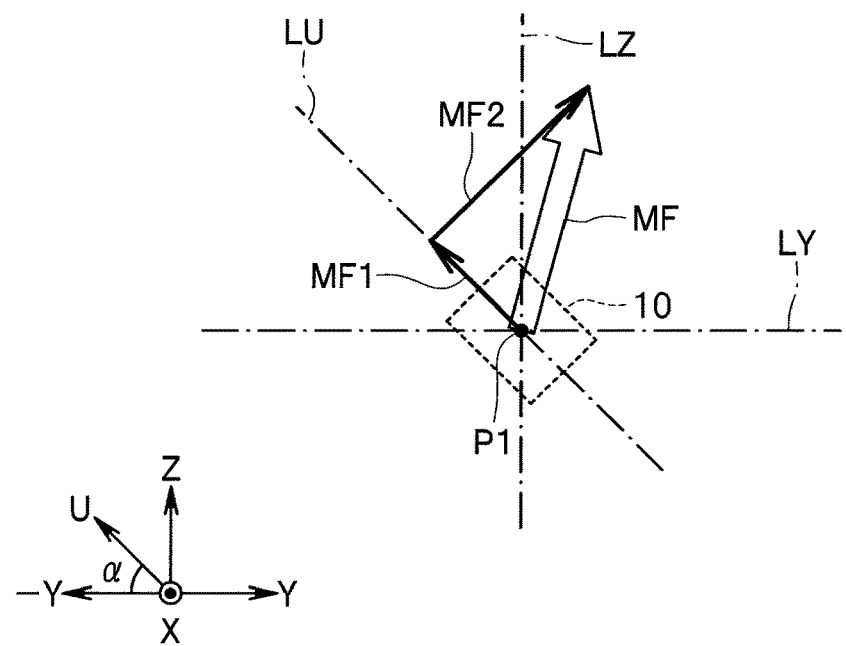
FIG. 9 is an explanatory diagram for describing a target magnetic field of the first embodiment of the invention.

FIG. 9 is an explanatory diagram for describing the target magnetic field MF. In FIG. 9, the position where the MR element 10 detects the target magnetic field MF is denoted by the symbol P1. In the present embodiment, the direction and strength of the target magnetic field MF at the position P1 coincide with those of the target magnetic field MF at the reference position on the rotation axis C (see FIG. 1). The direction of the target magnetic field MF at the position P1 rotates about the position P1.

In FIG. 9, an imaginary straight line that passes the position P1 and is parallel to the Y direction is denoted by the symbol LY. An imaginary straight line that passes the position P1 and is parallel to the Z direction is denoted by the symbol LZ. An imaginary straight line that passes the position P1 and is parallel to the U direction is denoted by the symbol LU. The target magnetic field MF at the position P1 can be divided into a component MF1 in a direction parallel to the U direction and a component MF2 in a direction parallel to a direction orthogonal to the U direction.

Figure 10:
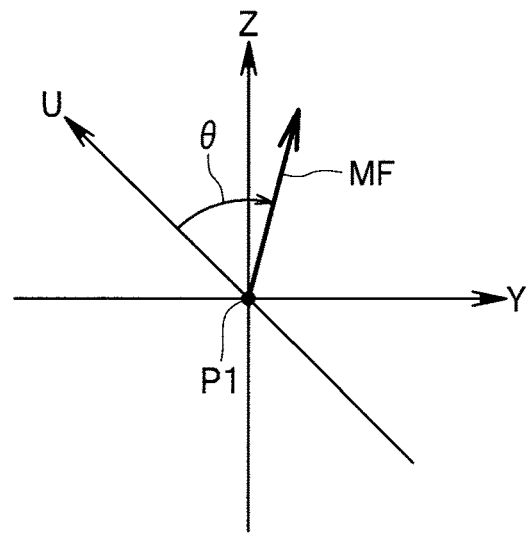
FIG. 10 is an explanatory diagram showing the definition of an angle that the direction of the target magnetic field forms with respect to a reference direction in the first embodiment of the present invention.

FIG. 10 is an explanatory diagram showing the definition of an angle that the direction of the target magnetic field MF forms with respect to a reference direction. In the present embodiment, the reference direction is the U direction. The angle that the direction of the target magnetic field MF at the position P1 forms with respect to the reference direction, i.e., the U direction is represented by the symbol θ. The angle θ is expressed in positive values when seen clockwise from the U direction in FIG. 10. The angle θ is expressed in negative values when seen counterclockwise from the U direction in FIG. 10.

The direction of the component MF1 is the U direction if the angle θ falls within the range of greater than or equal to 0° and less than 900 or the range of greater than 2700 and less than or equal to 360°. The direction of the component MF1 is the −U direction if the angle θ falls within the range of greater than 90° and less than 270°. Hereinafter, the strength of the component MF1 is expressed in positive values when the direction of the component MF1 is the U direction. The strength of the component MF1 is expressed in negative values when the direction of the component MF1 is the −U direction.

In the magnetic sensor 1, the directions of the magnetization of the magnetization pinned layers 52 in the MR elements 11 to 14 and the shape anisotropy of the free layers 54 in the MR elements 11 to 14 are set so that the strength of the component MF1 of the target magnetic field MF at the position P1 can be detected. In FIG. 6, the thick arrow indicates the direction of the magnetization in the magnetization pinned layer 52. The X and U directions are shown in FIG. 6. As shown in FIG. 6, the directions of the magnetization in the magnetization pinned layers 52 in the MR elements 11 and 13 are the U direction. The directions of the magnetization in the magnetization pinned layers 52 in the MR elements 12 and 14 are the −U direction. The free layer 54 has shape anisotropy such that the direction of the easy axis of magnetization is parallel to the X direction.

If the strength of the component MF1 is 0, i.e., the direction of the target magnetic field MF is orthogonal to the U direction, the directions of the magnetization in the free layers 54 are the X or −X direction. If the strength of the component MF1 has a positive value, the directions of the magnetization in the free layers 54 tilt from the X or −X direction toward the U direction. As a result, the resistances of the MR elements 11 and 13 decrease and the resistances of the MR elements 12 and 14 increase, compared to when the strength of the component MF1 is 0. By contrast, if the strength of the component MF1 has a negative value, the resistances of the MR elements 11 and 13 increase and the resistances of the MR elements 12 and 14 decrease, compared to when the strength of the component MF1 is 0. The amounts of change in the resistances of the respective MR elements 11 to 14 depend on the strength of the component MF1.

Change in the strength of the component MF1 causes the resistance values of the MR elements 11 to 14 to change such that the resistance values of the MR elements 11 and 13 increase while the resistance values of the MR elements 12 and 14 decrease, or such that the resistance values of the MR elements 11 and 13 decrease while the resistance values of the MR elements 12 and 14 increase. This causes a change in the potential difference between the signal output nodes E11 and E12. The differential detector 21 outputs a signal corresponding to a potential difference between the signal output nodes E11 and E12 as the detection signal S1. The detection signal S1 has a correspondence with the strength of the component MF1. The strength of the component MF1 has a correspondence with the direction of the target magnetic field MF. The direction of the target magnetic field MF has a correspondence with a relative position, or rotational position in particular, of the magnetic field generator 5 with respect to the magnetic sensor 1. The detection signal S1 thus has a correspondence with the rotational position.

The detection value generation circuit 22 generates the detection value Vs on the basis of the detection signal S1. The detection value generation circuit 22 may generate a value indicating the strength of the component MF1 as the detection value Vs. The value indicating the strength of the component MF1 can be generated, for example, by dividing the value of the detection signal S1 by the ratio of a change in the detection signal S1 to a change in the strength of the component MF1.

Alternatively, the detection value generation circuit 22 may generate a value indicating the angle θ that the direction of the target magnetic field MF at the position P1 forms with respect to the U direction as the detection value Vs within the range of greater than or equal to 0° and less than 180°. In such a case, the detection value generation circuit 22 initially generates a normalization signal S1c. The normalization signal S1c is a signal generated by normalizing the detection signal S1 so that the detection signal S1 has a value of 1 when the angle θ is 0°, and a value of −1 when the angle θ is 180°. The detection value generation circuit 22 then generates the detection value Vs using the normalization signal S1c by the following Eq. (1):

$$Vs = acos(S1c) \quad (1)$$

"acos" represents arccosine.

As described above, in the present embodiment, the direction and strength of the target magnetic field MF at the position P1 coincide with those of the target magnetic field MF at the reference position. The strength of the component MF1 can thus be regarded as the strength of the component of the target magnetic field MF at the reference position in the direction parallel to the U direction. The angle θ that the direction of the target magnetic field MF at the position P1 forms with respect to the U direction can be regarded as the angle that the direction of the target magnetic field MF at the reference position forms with respect to the U direction.

In either of the cases where the value indicating the strength of the component MF1 is generated as the detection value Vs and where the value indicating the angle θ is generated as the detection value Vs, the detection value Vs has a correspondence with the relative position, or rotational position in particular, of the magnetic field generator 5 with respect to the magnetic sensor 1.

Next, the configuration of the coil 30 will be described in more detail. The coil 30 includes at least one conductor portion. The coil magnetic field includes a partial magnetic field generated by each of the at least one conductor portion.

The at least one conductor portion is each located at a position such that the partial magnetic field generated by the conductor portion is applied to one of the at least one MR element, the one corresponding to the conductor portion. In the present embodiment, the coil 30 includes four conductor portions 31, 32, 33, and 34 as the at least one conductor portion. The conductor portion 31 corresponds to the MR element 11 and is located at a position such that the partial magnetic field generated by the conductor portion 31 is applied to the MR element 11. The conductor portion 32 corresponds to the MR element 12 and is located at a position such that the partial magnetic field generated by the conductor portion 32 is applied to the MR element 12. The conductor portion 33 corresponds to the MR element 13 and is located at a position such that the partial magnetic field generated by the conductor portion 33 is applied to the MR element 13. The conductor portion 34 corresponds to the MR element 14 and is located at a position such that the partial magnetic field generated by the conductor portion 34 is applied to the MR element 14.

In particular, in the present embodiment, all the conductor portions 31 to 34 are part of the upper coil portions 30U. The conductor portions 31 to 34 will hereinafter be referred to as upper conductor portions 31 to 34. For ease of understanding, the upper conductor portions 31 to 34 are shown hatched in FIG. 2. The upper conductor portions 31 to 34 are all located on the insulating layer 67 (see FIG. 5). The insulating layer 67 covers the MR elements 11 to 14 and the top surface 40a of the support member 40.

The upper conductor portion 31 is located at a position to sandwich the MR element 11 with the support member 40. The upper conductor portion 32 is located at a position to sandwich the MR element 12 with the support member 40. The upper conductor portion 33 is located at a position to sandwich the MR element 13 with the support member 40. The upper conductor portion 34 is located at a position to sandwich the MR element 14 with the support member 40.

The coil 30 further includes lower conductor portions 35, 36, 37, and 38. The lower conductor portions 35 to 38 are different part of the coil 30 from the upper conductor portions 31 to 34. In particular, in the present embodiment, all the lower conductor portions 35 to 38 are part of the lower coil portions 30L located on the bottom surface 40b side of the support member 40. For ease of understanding, the lower conductor portions 35 to 38 are shown hatched in FIG. 3. The lower conductor portions 35 to 38 correspond to the "at least one second conductor portion" according to the present invention.

The coil magnetic field further includes partial magnetic fields generated by the respective lower conductor portions 35 to 38. The partial magnetic fields generated by the respective lower conductor portions 35 to 38 correspond to the "second partial magnetic field" according to the present invention.

The lower conductor portion 35 corresponds to the MR element 11 and is located at a position such that the partial magnetic field generated by the lower conductor portion 35 is applied to the MR element 11. The lower conductor portion 36 corresponds to the MR element 12 and is located at a position such that the partial magnetic field generated by the lower conductor portion 36 is applied to the MR element 12. The lower conductor portion 37 corresponds to the MR element 13 and is located at a position such that the partial magnetic field generated by the lower conductor portion 37 is applied to the MR element 13. The lower conductor portion 38 corresponds to the MR element 14 and is located at a position such that the partial magnetic field generated by the lower conductor portion 38 is applied to the MR element 14.

The lower conductor portion 35 is located at a position to sandwich the support member 40 with the MR element 11. The lower conductor portion 36 is located at a position to sandwich the support member 40 with the MR element 12. The lower conductor portion 37 is located at a position to sandwich the support member 40 with the MR element 13.

The lower conductor portion 38 is located at a position to sandwich the support member 40 with the MR element 14.

Figure 11:
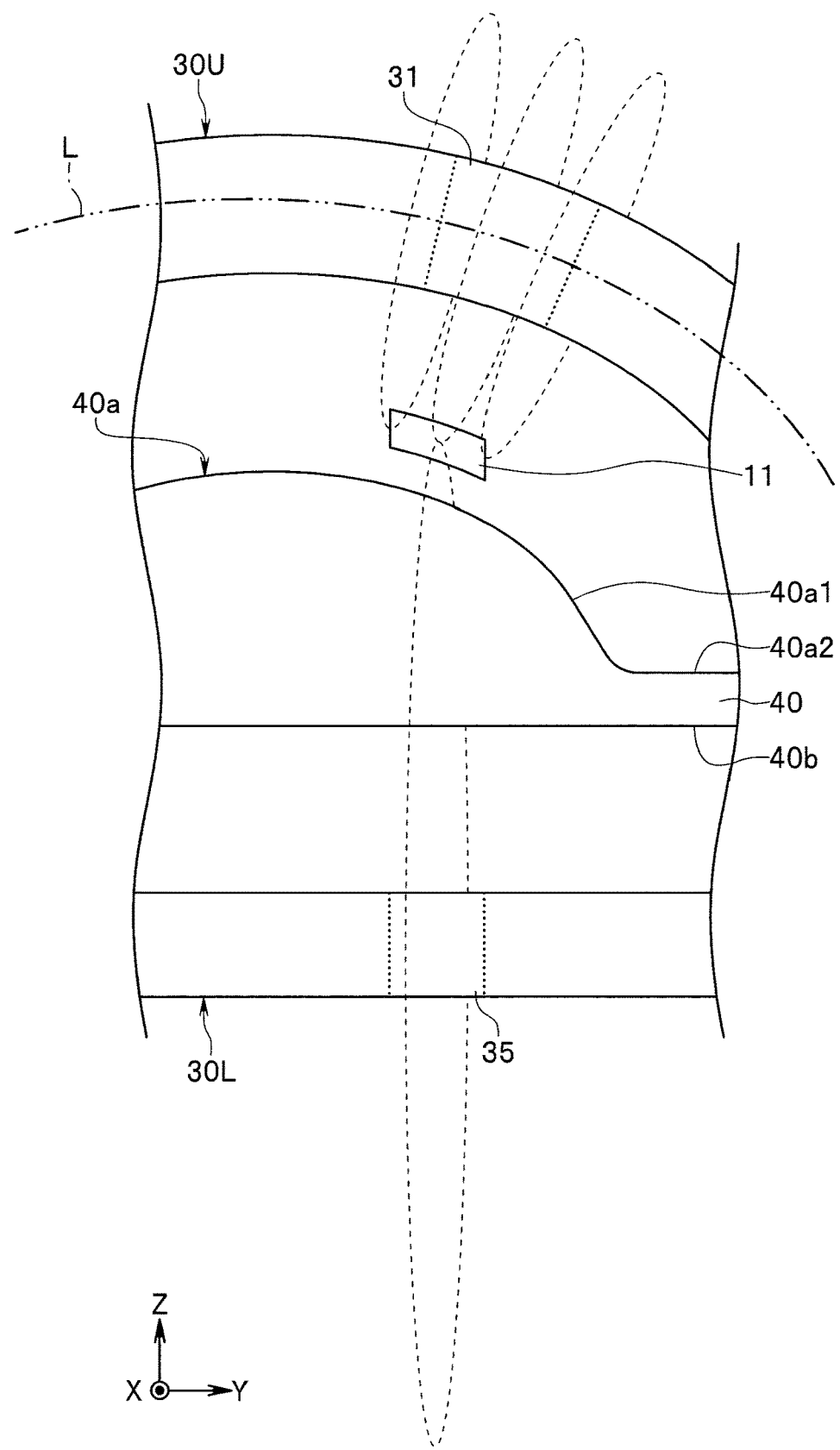
FIG. 11 is an explanatory diagram for describing the shape of an upper conductor portion and a lower conductor portion of the first embodiment of the present invention.

Now, the shape of the upper conductor portions 31 to 34 and the lower conductor portions 35 to 38 will be described with reference to FIG. 11. FIG. 11 is an explanatory diagram for describing the shape of the upper conductor portion 31 and the lower conductor portion 35. In FIG. 11, borders between the upper conductor portion 31 and the other parts of the upper coil portion 30U are indicated by dotted lines. In FIG. 11, borders between the lower conductor portion 35 and the other parts of the lower coil portion 30L are indicated by dotted lines.

The upper conductor portion 31 extends along an imaginary curve L curving to protrude in a direction away from the MR element 11. In FIG. 11, the imaginary curve L is represented by a double-dotted dashed line denoted by the symbol L. The imaginary curve L is a curve parallel to the YZ plane. In the example shown in FIG. 11, the direction away from the MR element 11 refers specifically to a direction tilted from the Z direction toward the Y direction by a predetermined angle greater than 0° and smaller than 90°. When seen from the MR element 11, the imaginary curve L curves to protrude in that direction. Apart of the upper conductor portion 31 extends in parallel with the surfaces of the layers constituting the MR element 11.

The lower conductor portion 35 extends along the Y direction. The lower conductor portion 35 extends not in parallel with the surfaces of the layers constituting the MR element 11.

Similarly, the upper conductor portion 32 extends along an imaginary curve curving to protrude in a direction away from the MR element 12. A part of the upper conductor portion 32 extends in parallel with the surfaces of the layers constituting the MR element 12. Similarly, the upper conductor portion 33 extends along an imaginary curve curving to protrude in a direction away from the MR element 13. A part of the upper conductor portion 33 extends in parallel with the surfaces of the layers constituting the MR element 13. Similarly, the upper conductor portion 34 extends along an imaginary curve curving to protrude in a direction away from the MR element 14. A part of the upper conductor portion 34 extends in parallel with the surfaces of the layers constituting the MR element 14. All the imaginary curves are parallel to the YZ plane.

Similarly, all the lower conductor portions 36 to 38 extend along the Y direction. The lower conductor portion 36 extends not in parallel with the surfaces of the layers constituting the MR element 12. The lower conductor portion 37 extends not in parallel with the surfaces of the layers constituting the MR element 13. The lower conductor portion 38 extends not in parallel with the surfaces of the layers constituting the MR element 14.

The function and effect of the magnetic sensor 1 according to the present embodiment will now be described. In the present embodiment, the upper conductor portions 31 to 34 of the coil 30 are each located at a position such that the partial magnetic field generated from the conductor portion is applied to the MR element 10 corresponding to the conductor portion. In addition, the upper conductor portions 31 to 34 each extend along an imaginary curve curving to protrude in a direction away from the corresponding MR element 10. According to the present embodiment, the coil 30 can thus apply a magnetic field of sufficient strength to the MR elements 10. This effect will now be described by using the combination of the upper conductor portion 31 and the MR element 11 as an example.

In FIG. 11, a plurality of broken lines overlapping the MR element 11 and the upper coil portion 30U represent the magnetic lines of force corresponding to the partial magnetic field generated by the upper conductor portion 31. The partial magnetic field is generated around the axis of the center line of the upper conductor portion 31 extending in the extending direction of the upper conductor portion 31. Like the imaginary curve L, the center line of the upper conductor portion 31 is a curve curving to protrude in the direction away from the MR element 11. Since the center line of the upper conductor portion 31 is such a curve, the partial magnetic field generated from near the both longitudinal ends of the upper conductor portion 31 tilt toward the MR element 11. As shown in FIG. 11, the plurality of magnetic lines of force corresponding to the partial magnetic field generated by the upper conductor portion 31 can thereby be concentrated on the MR element 11. This increases the strength of the partial magnetic field applied to the MR element 11 compared to the case where the center line of the upper conductor portion 31 is a straight line or a curve curving to protrude in a direction toward the MR element 11, if comparison is made supposing that the center position in the extending direction of the upper conductor portion 31 is the same.

The foregoing description of the combination of the upper conductor portion 31 and the MR element 11 also applies to the combination of the upper conductor portion 32 and the MR element 12, the combination of the upper conductor portion 33 and the MR element 13, and the combination of the upper conductor portion 34 and the MR element 14. According to the present embodiment, the coil 30 can thus apply a magnetic field of sufficient strength to the MR elements 10.

According to the present embodiment, the strength of the partial magnetic fields applied to the MR elements 10 can be increased as described above. The coil 30 can thus apply a magnetic field of sufficient strength to the MR elements 10 even if the amount of the current passed through the coil 30 is limited by the limitation of the magnetic sensor system 100, like when the detection value generation circuit 22 and the coil 30 share a common power supply.

In the present embodiment, the top surface 40a of the support member 40 supporting the MR elements 10 includes the curved surface portion 40a1. The curved surface portion 40a1 curves to protrude in the direction away from the bottom surface 40b of the support member 40. The curved surface portion 40a1 having such a shape can be formed, for example, by depositing the insulating layer constituting the support member 40 so that the thickness of the insulating layer differs at a plurality of different positions in the second direction. Moreover, the magnetic sensor 1 includes the insulating layers 65 to 67 covering the MR elements 10 and the top surface 40a of the support member 40. The upper conductor portions 31 to 34 are located on the insulating layer 67. According to the present embodiment, the insulating layers 65 to 67 are each formed along the curved surface portion 40a1. The upper conductor portions 31 to 34 can thereby be shaped to extend along the curved surface portion 40a1. The imaginary curves along which the respective upper conductor portions 31 to 34 thus curve along the curved surface portion 40a1.

In the present embodiment, the coil 30 further includes the lower conductor portions 35 to 38. In FIG. 11, a plurality of broken lines overlapping the MR element 11 and the lower coil portion 30L represent the magnetic lines of force corresponding to the partial magnetic field generated by the lower conductor portion 35. As shown in FIG. 11, the partial magnetic field generated by the lower conductor portion 35 is applied to the MR element 11. According to the present embodiment, the strength of the partial magnetic field applied to the MR element 11 can thereby be further increased. The foregoing description of the combination of the lower conductor portion 35 and the MR element 11 also applies to the combination of the lower conductor portion 36 and the MR element 12, the combination of the lower conductor portion 37 and the MR element 13, and the combination of the lower conductor portion 38 and the MR element 14. According to the present embodiment, a magnetic field of even higher strength can thus be applied to the MR elements 10 by the coil 30.

By the way, in the present embodiment, the coil magnetic field generated by the coil 30 is used to orient the directions of the magnetization of the free layers 54 in the MR elements 10 to a predetermined direction, i.e., the X or −X direction. The coil magnetic field can be temporarily applied to the MR elements 10. According to the present embodiment, the directions of the magnetization of the free layers 54 upon starting use of the magnetic sensor 1 can thereby be aligned to a predetermined direction.

Modification Examples

Figure 12:
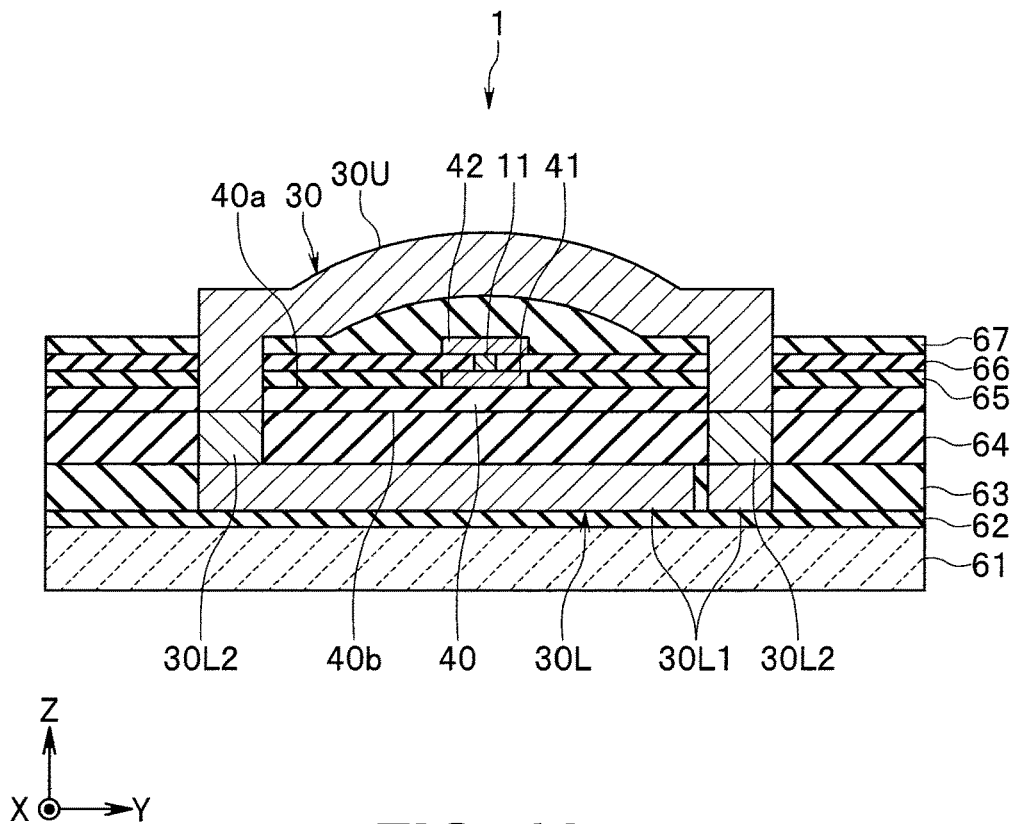
FIG. 12 is a sectional view showing a cross section of a first modification example of the magnetic sensor according to the first embodiment of the present invention.

Now, a description will be given of first and second modification examples of the magnetic sensor 1 according to the present embodiment. Initially, a first modification example of the magnetic sensor 1 will be described. FIG. 12 is a sectional view showing a cross section of the first modification example of the magnetic sensor 1. In the first modification example, the top surface 40a of the support member 40 does not include the curved surface portion 40a1 but is a flat surface parallel to the XY plane.

In the first modification example, the MR elements 10 are located on the top surface 40a of the support member 40. The lower electrodes 41 are interposed between the MR elements 10 and the support member 40. The bottom surfaces of the MR elements 10 and the surfaces of the layers constituting the MR elements 10 are flat surfaces parallel to the XY plane.

In the first modification example, the insulating layer 67 has a top surface located at an end in the Z direction. The top surface includes a curved surface portion. The curved surface portion has the same shape as that of the curved surface portion 40a1 of the top surface 40a of the support member 40 shown in FIG. 5. The insulating layer 67 has a shape such that the curved surface portion is formed on the top surface of the insulating layer 67. Specifically, the insulating layer 67 has a shape of bulging out in the Z direction in a given cross section parallel to the YZ plane.

In the first modification example, the upper conductor portions 31 to 34 and the lower conductor portions 35 to 38 of the coil 30 have the same shapes as in the example shown in FIGS. 1 to 5. The upper conductor portions 31 to 34 of the coil 30 therefore extend not in parallel with the surfaces of the layers constituting the MR elements 11 to 14, respectively. On the other hand, the lower conductor portions 35 to 38 of the coil 30 extend in part in parallel with the surfaces of the layers constituting the MR elements 11 to 14, respectively.

Figure 13:
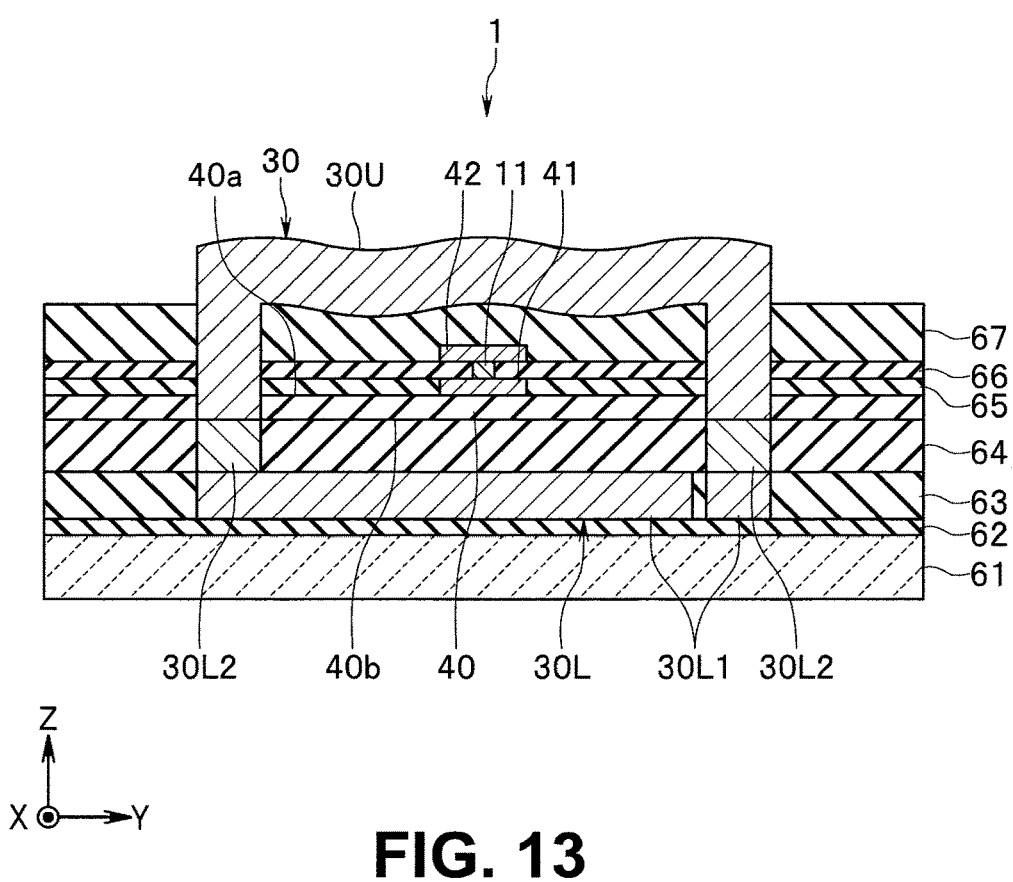
FIG. 13 is a sectional view showing a cross section of a second modification example of the magnetic sensor according to the first embodiment of the present invention.

Next, a second modification example of the magnetic sensor 1 will be described with reference to FIG. 13. FIG. 13 is a sectional view showing a cross section of the second modification example of the magnetic sensor 1. The second modification example is different from the first modification example in the following respects. In the second modification example, the top surface of the insulating layer 67 includes a periodic curved surface portion curving periodically. The upper coil portions 30U of the coil 30 have a meandering shape along the periodic curved surface portion. Note that the upper conductor portions 31 to 34 that are part of the upper coil portions 30U each satisfy the requirement to extend along an imaginary curve curving to protrude in a direction away from the corresponding MR element 10.

Second Embodiment

Figure 14:
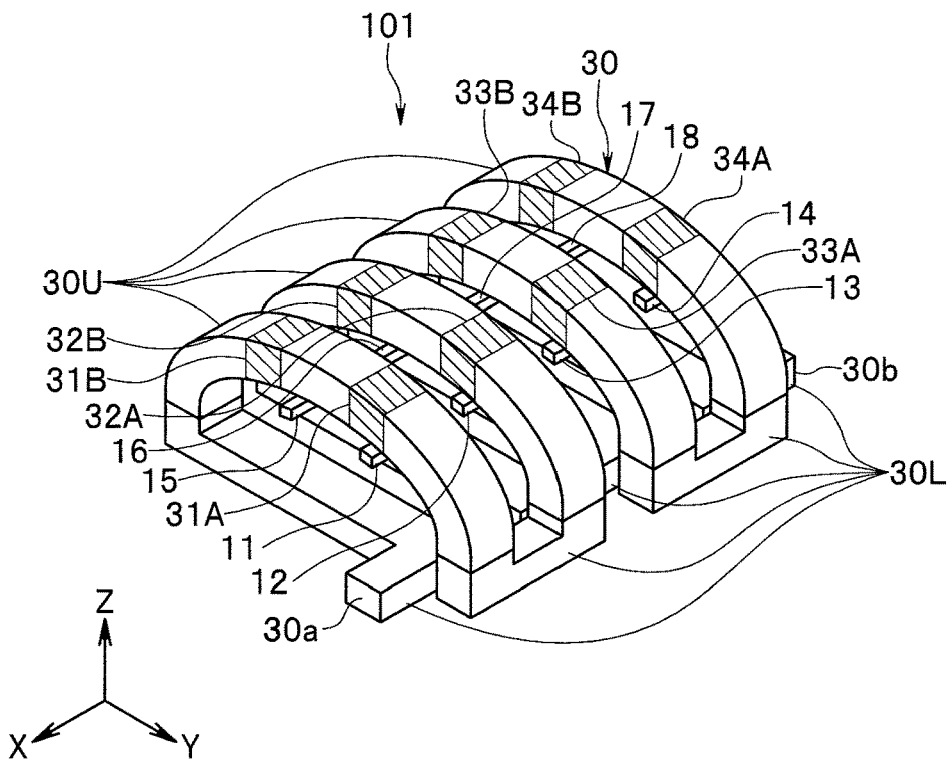
FIG. 14 is a perspective view showing magnetoresistive elements and a coil of a magnetic sensor according to a second embodiment of the invention.
Figure 15:
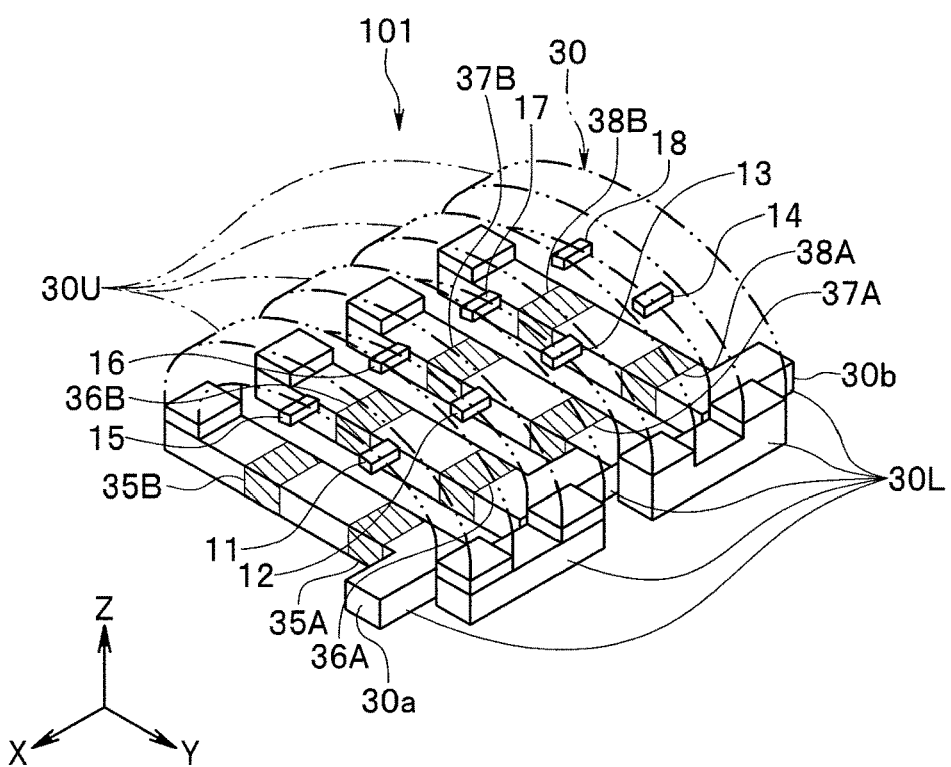
FIG. 15 is a perspective view showing the magnetoresistive elements and the coil of the magnetic sensor according to the second embodiment of the invention.
Figure 16:
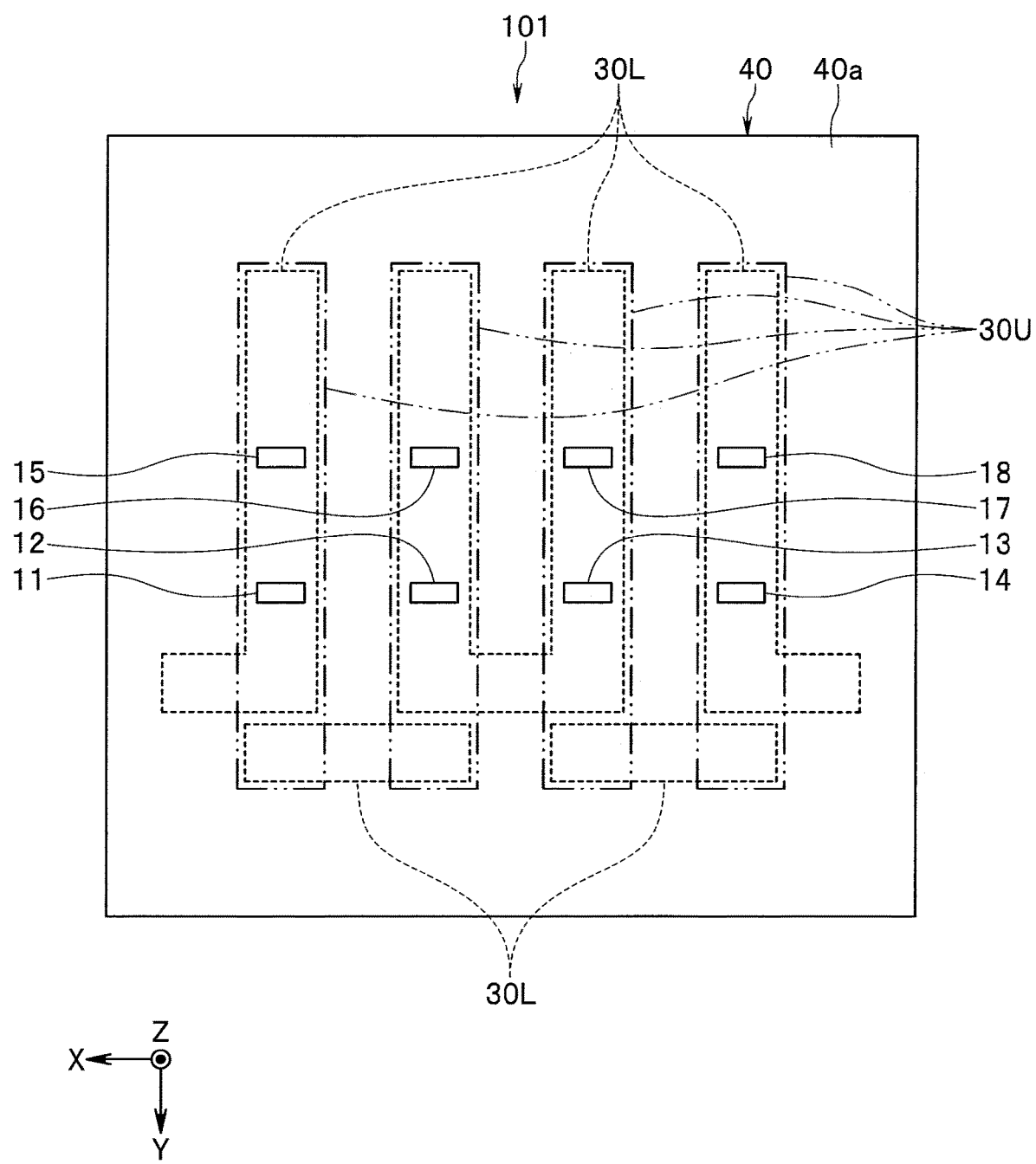
FIG. 16 is a plan view showing the magnetic sensor according to the second embodiment of the invention.
Figure 17:
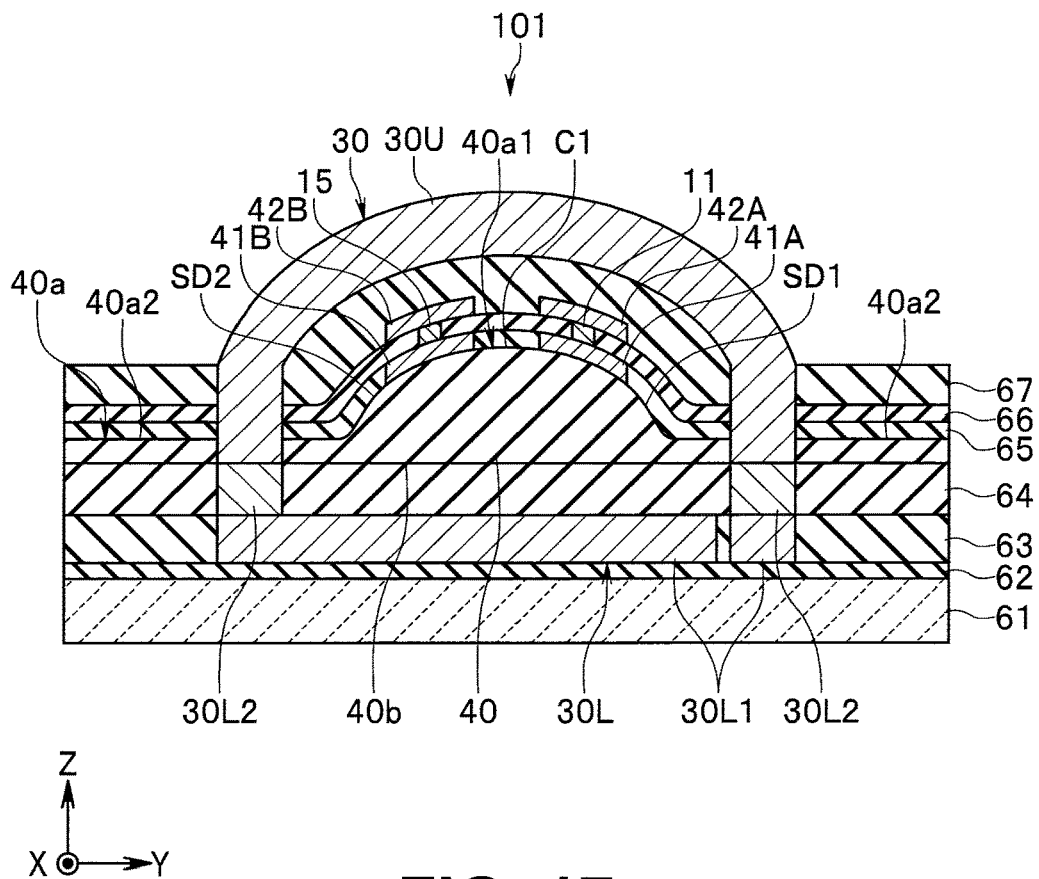
FIG. 17 is a sectional view showing a cross section of the magnetic sensor according to the second embodiment of the invention.
Figure 18:
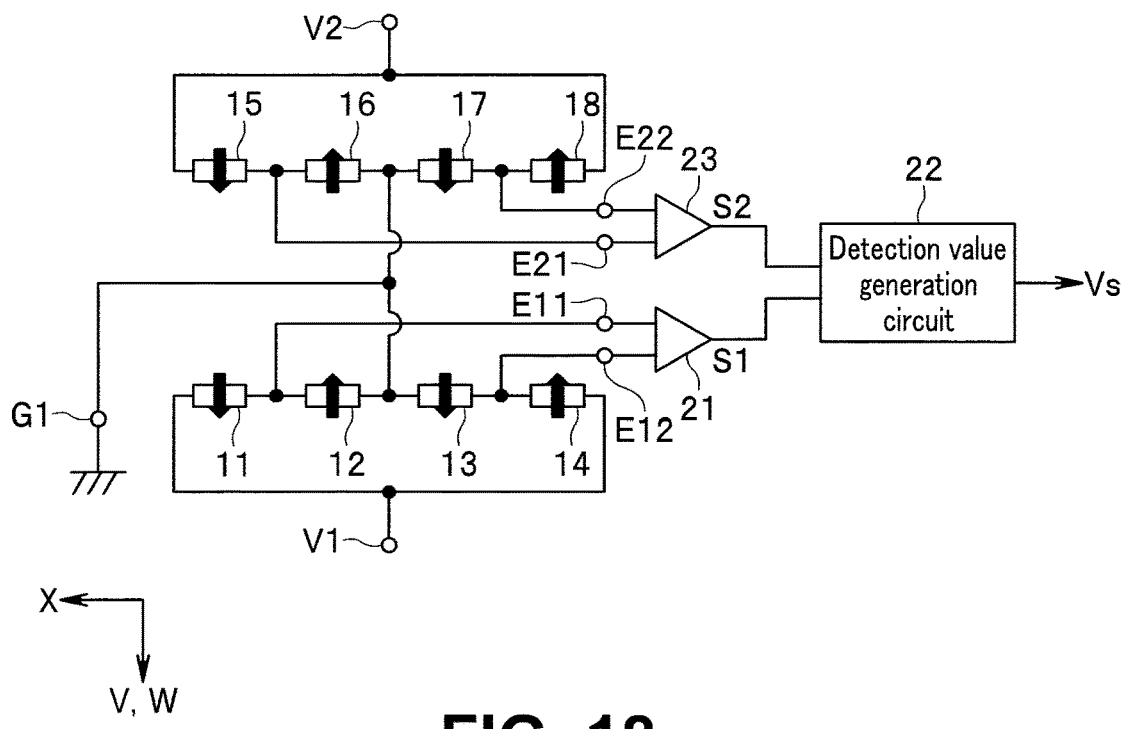
FIG. 18 is a circuit diagram showing the circuit configuration of the magnetic sensor according to the second embodiment of the invention.

A second embodiment of the invention will now be described. Initially, a configuration of a magnetic sensor according to the present embodiment will be described with reference to FIGS. 14 to 18. FIGS. 14 and 15 are perspective views each showing magnetoresistive elements and a coil of the magnetic sensor according to the present embodiment. FIG. 16 is a plan view showing the magnetic sensor according to the present embodiment. FIG. 17 is a sectional view showing a cross section of the magnetic sensor according to the present embodiment. FIG. 18 is a circuit diagram showing the circuit configuration of the magnetic sensor according to the present embodiment.

A magnetic sensor 101 according to the present embodiment is different from the magnetic sensor 1 according to the first embodiment in the following respects. The magnetic sensor 101 includes four MR elements 15, 16, 17, and 18 as at least one MR element in addition to the MR elements 11 to 14 according to the first embodiment. The MR elements 15 to 18 are located on the curved surface portion 40a1 of the top surface 40a of the support member 40 along with the MR elements 11 to 14. In particular, all the MR elements 15 to 18 are located on the second side portion SD2 of the curved surface portion 40a1. Lower electrodes to be described later are interposed between the MR elements 15 to 18 and the support member 40.

As shown in FIG. 16, the MR elements 15 to 18 are arranged in a row in this order along the −X direction, at positions in front of the MR elements 11 to 14 in the −Y direction. As described in the first embodiment, the second direction is a direction parallel to the Y direction. The MR elements 11 and 15 are located at positions symmetrical or substantially symmetrical about an XZ plane intersecting the center of the curved surface portion 40a1 in the second direction. Similarly, the MR elements 12 and 16 are located at positions symmetrical or substantially symmetrical about the XZ plane. Similarly, the MR elements 13 and 17 are located at positions symmetrical or substantially symmetrical about the XZ plane. Similarly, the MR elements 14 and 18 are located at positions symmetrical or substantially symmetrical about the XZ plane.

The MR elements 15 to 18 each have the same configuration as that of each of the MR elements 11 to 14. Specifically, the MR elements 15 to 18 each include a stack of a plurality of layers. Assuming that the surfaces of the layers are flat surfaces, the MR elements 15 to 18 are each located on the second side portion SD2 in an orientation such that the surfaces of the layers are oblique to the XY plane. The MR elements 15 to 18 each have a bottom surface opposed to the support member 40. The bottom surfaces of the MR elements 15 to 18 are curved surfaces curved along the curved surface portion 40a1.

The magnetic sensor 101 according to the present embodiment includes a plurality of lower electrodes 41A, a plurality of lower electrodes 41B, a plurality of upper electrodes 42A, and a plurality of upper electrodes 42B instead of the plurality of lower electrodes 41 and the plurality of upper electrodes 42 according to the first embodiment. For example, the electrodes 41A, 41B, 42A, and 42B are made of the same material as that of the electrodes 41 and 42 according to the first embodiment. The plurality of lower electrodes 41A and the plurality of upper electrodes 42A electrically connect the MR elements 11 to 14. The shape and layout of the plurality of lower electrodes 41A and the plurality of upper electrodes 42A are the same as those of the plurality of lower electrodes 41 and the plurality of upper electrodes 42 according to the first embodiment.

The plurality of lower electrodes 41B and the plurality of upper electrodes 42B electrically connect the MR elements 15 to 18. The plurality of lower electrodes 41B are located on the top surface 40a of the support member 40. The plurality of lower electrodes 41B on the top surface 40a of the support member 40 are mainly located on the second side portion SD2 of the curved surface portion 40a1. The MR elements 15 to 18 are located on the plurality of lower electrodes 41B.

In the present embodiment, the insulating layer 65 is located on the top surface 40a of the support member 40, around the plurality of lower electrodes 41A and the plurality of lower electrodes 41B. The insulating layer 66 is located on the plurality of lower electrodes 41A, the plurality of lower electrodes 41B and the insulating layer 65, around the MR elements 11 to 18. The plurality of upper electrodes 42A are located on the MR elements 11 to 14 and the insulating layer 66. The plurality of upper electrodes 42B are located on the MR elements 15 to 18 and the insulating layer 66. The insulating layer 67 is located on the plurality of upper electrodes 42A, the plurality of upper electrodes 42B, and the insulating layer 66. In FIG. 16, the plurality of lower electrodes 41A, the plurality of lower electrodes 41B, the plurality of upper electrodes 42A, the plurality of upper electrodes 42B, and the insulating layers 65 to 67 are omitted.

In the present embodiment, the MR elements 11 to 18 are integrated with the coil 30. The coil 30 is wound around the MR elements 11 to 18. In particular, in the present embodiment, the coil 30 is wound so that a coil magnetic field in the X or −X direction is applied to each of the MR elements 11 to 18. For example, if a current is passed in a direction from the first end 30a of the coil 30 to the second end 30b of the coil 30, a coil magnetic field in the −X direction is applied to the MR elements 11, 13, 15 and 17 and a coil magnetic field in the X direction is applied to the MR elements 12, 14, 16 and 18. In FIGS. 15 and 16, the upper coil portions 30U of the coil 30 are shown by double-dotted dashed lines. In FIG. 16, the bottom coil portions 30L of the coil 30 are shown by broken lines.

As shown in FIG. 18, the magnetic sensor 101 according to the present embodiment further includes a power supply node V2, two signal output nodes E21 and E22, and a differential detector 23. The MR element 15 is arranged between the power supply node V2 and the signal output node E21. The MR element 16 is arranged between the signal output node E21 and the ground node G1. The MR element 17 is arranged between the signal output node E22 and the ground node G1. The MR element 18 is arranged between the power supply node V2 and the signal output node E22. A predetermined magnitude of power supply voltage is applied to the power supply node V2, like the power supply node V1. The differential detector 23 outputs a signal corresponding to a potential difference between the signal output nodes E21 and E22 as the detection signal S2.

In the present embodiment, the detection value generation circuit 22 generates a detection value Vs on the basis of the detection signal S1 output from the differential detector 21 and the detection signal S2 output from the differential detector 23. A method for generating the detection value Vs of the present embodiment will be described later.

In the present embodiment, the coil 30 includes eight upper conductor portions 31A, 32A, 33A, 34A, 31B, 32B, 33B, and 34B, and eight lower conductor portions 35A, 36A, 37A, 38A, 35B, 36B, 37B, and 38B instead of the upper conductor portions 31 to 34 and the lower conductor portions 35 to 38 according to the first embodiment.

The upper conductor portions 31A to 34A and 31B to 34B correspond to the "at least one conductor portion" according to the present invention. All the upper conductor portions 31A to 34A and 31B to 34B are part of the upper coil portions 30U. For ease of understanding, the upper conductor portions 31A to 34A and 31B to 34B are shown hatched in FIG. 14. The upper conductor portions 31A to 34A and 31B to 34B are all located on the insulating layer 67.

The lower conductor portions 35A to 38A and 35B to 38B correspond to the "at least one second conductor portion" according to the present invention. The lower conductor portions 35A to 38A and 35B to 38B are different part of the coil 30 from the upper conductor portions 31A to 34A and 31B to 34B. In particular, in the present embodiment, all the lower conductor portions 35A to 38A and 35B to 38B are part of the lower coil portions 30L located on the bottom surface 40b side of the support member 40. For ease of understanding, the lower conductor portions 35A to 38A and 35B to 38B are shown hatched in FIG. 15.

The shape and layout of the upper conductor portions 31A to 34A and the lower conductor portions 35A to 38A are the same as those of the upper conductor portions 31 to 34 and the lower conductor portions 35 to 38 according to the first embodiment.

The upper conductor portion 31B corresponds to the MR element 15 and is located at a position such that the partial magnetic field generated by the upper conductor portion 31B is applied to the MR element 15. The upper conductor portion 32B corresponds to the MR element 16 and is located at a position such that the partial magnetic field generated by the upper conductor portion 32B is applied to the MR element 16. The upper conductor portion 33B corresponds to the MR element 17 and is located at a position such that the partial magnetic field generated by the upper conductor portion 33B is applied to the MR element 17. The upper conductor portion 34B corresponds to the MR element 18 and is located at a position such that the partial magnetic field generated by the upper conductor portion 34B is applied to the MR element 18.

The upper conductor portion 31B is located at a position to sandwich the MR element 15 with the support member 40. The upper conductor portion 32B is located at a position to sandwich the MR element 16 with the support member 40. The upper conductor portion 33B is located at a position to sandwich the MR element 17 with the support member 40. The upper conductor portion 34B is located at a position to sandwich the MR element 18 with the support member 40.

The lower conductor portion 35B corresponds to the MR element 15 and is located at a position such that the partial magnetic field generated by the lower conductor portion 35B is applied to the MR element 15. The lower conductor portion 36B corresponds to the MR element 16 and is located at a position such that the partial magnetic field generated by the lower conductor portion 36B is applied to the MR element 16. The lower conductor portion 37B corresponds to the MR element 17 and is located at a position such that the partial magnetic field generated by the lower conductor portion 37B is applied to the MR element 17. The lower conductor portion 38B corresponds to the MR element 18 and is located at a position such that the partial magnetic field generated by the lower conductor portion 38B is applied to the MR element 18.

The lower conductor portion 35B is located at a position to sandwich the support member 40 with the MR element 15. The lower conductor portion 36B is located at a position to sandwich the support member 40 with the MR element 16. The lower conductor portion 37B is located at a position to sandwich the support member 40 with the MR element 17. The lower conductor portion 38B is located at a position to sandwich the support member 40 with the MR element 18.

Figure 19:
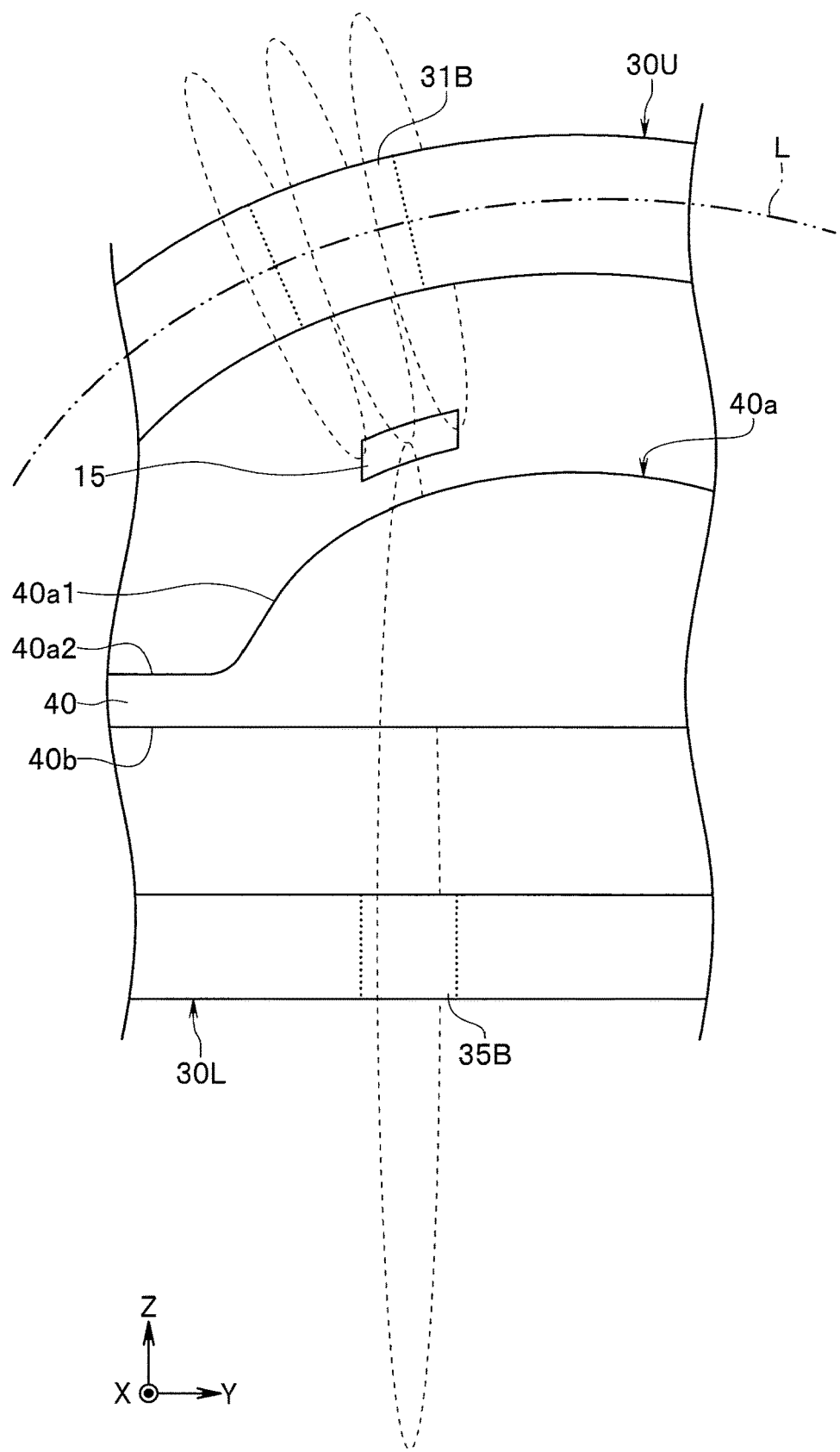
FIG. 19 is an explanatory diagram for describing the shape of an upper conductor portion and a lower conductor portion of the second embodiment of the present invention.

FIG. 19 is an explanatory diagram for describing the shape of the upper conductor portion 31B and the lower conductor portion 35B. In FIG. 19, borders between the upper conductor portion 31B and the other parts of the upper coil portion 30U are indicated by dotted lines. In FIG. 19, borders between the lower conductor portion 35B and the other parts of the lower coil portion 30L are indicated by dotted lines.

The upper conductor portion 31B extends along an imaginary curve L curving to protrude in a direction away from the MR element 15. In FIG. 19, the imaginary curve L is represented by a double-dotted dashed line denoted by the symbol L. The imaginary curve L is a curve parallel to the YZ plane. In the example shown in FIG. 19, the direction away from the MR element 15 refers specifically to a direction tilted from the Z direction toward the −Y direction by a predetermined angle greater than 0° and smaller than 90°. When seen from the MR element 15, the imaginary curve L curves to protrude in that direction. Apart of the upper conductor portion 31B extends in parallel with the surfaces of the layers constituting the MR element 15. In FIG. 19, a plurality of broken lines overlapping the MR element 15 and the upper coil portion 30U represent the magnetic lines of force corresponding to the partial magnetic field generated by the upper conductor portion 31B.

The lower conductor portions 35B extends along the Y direction. The lower conductor portion 35B extends not in parallel with the surfaces of the layers constituting the MR element 15. In FIG. 19, a plurality of broken lines overlapping the MR element 15 and the lower coil portion 30L represent the magnetic lines of force corresponding to the partial magnetic field generated by the lower conductor portion 35B.

Similarly, the upper conductor portion 32B extends along an imaginary curve curving to protrude in a direction away from the MR element 16. A part of the upper conductor portion 32B extends in parallel with the surfaces of the layers constituting the MR element 16. Similarly, the upper conductor portion 33B extends along an imaginary curve curving to protrude in a direction away from the MR element 17. A part of the upper conductor portion 33B extends in parallel with the surfaces of the layers constituting the MR element 17. Similarly, the upper conductor portion 34B extends along an imaginary curve curving to protrude in a direction away from the MR element 18. A part of the upper conductor portion 34B extends in parallel with the surfaces of the layers constituting the MR element 18. All the imaginary curves are parallel to the YZ plane.

Similarly, all the lower conductor portions 36B to 38B extend along the Y direction. The lower conductor portion 36B extends not in parallel with the surfaces of the layers constituting the MR element 16. The lower conductor portion 37B extends not in parallel with the surfaces of the layers constituting the MR element 17. The lower conductor portion 38B extends not in parallel with the surfaces of the layers constituting the MR element 18.

Next, a method for generating the detection value Vs of the present embodiment will be described. In describing any one of the MR elements 11 to 14, the MR element will hereinafter be denoted by the reference numeral 10A. In describing any one of the MR elements 15 to 18, the MR element will be denoted by the reference numeral 10B. The MR element 10A will be referred to as a first MR element 10A, and the MR element 10B a second MR element 10B. The first MR element 10A corresponds to the MR element 10 according to the first embodiment.

Assuming that the surfaces of the layers constituting the first MR elements 10A are flat surfaces, one direction parallel to the surfaces of the layers and orthogonal to the X direction will be referred to as a V direction. The direction opposite to the V direction will be referred to as a −V direction. Assuming that the surfaces of the layers are flat surfaces as described in the first embodiment, the first MR elements 10A are located on the first side portion SD1 in an orientation such that the surfaces of the layers are oblique to the XY plane. This makes the V direction different from the Y or −Y direction. In the present embodiment, the V direction is a direction rotated from the Y direction toward the −Z direction by α. α is an angle of greater than 0° and smaller than 90°.

Figure 20:
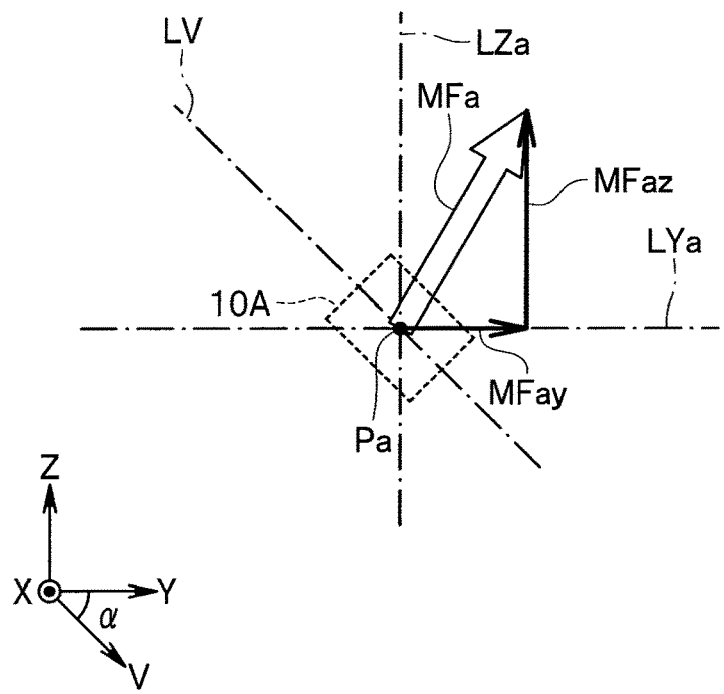
FIG. 20 is an explanatory diagram for describing a target magnetic field for a first magnetoresistive element according to the second embodiment of the present invention to detect.

FIG. 20 is an explanatory diagram for describing a target magnetic field MF for the first MR element 10A to detect. In FIG. 20, the position where the first MR element 10A detects the target magnetic field MF is denoted by the symbol Pa. In the present embodiment, the direction and strength of the target magnetic field MF at the position Pa coincide with those of the target magnetic field MF at the reference position on the rotation axis C (see FIG. 1). The direction of the target magnetic field MF at the position Pa rotates about the position Pa. The target magnetic field MF at the position Pa will hereinafter be denoted by the symbol MFa.

In FIG. 20, an imaginary straight line that passes the position Pa and is parallel to the Y direction will be denoted by the symbol LYa. An imaginary straight line that passes the position Pa and is parallel to the Z direction will be denoted by the symbol LZa. An imaginary straight line that passes the position Pa and is parallel to the V direction will be denoted by the symbol LV.

In the magnetic sensor 101, the directions of the magnetization of the magnetization pinned layers 52 in the MR elements 11 to 14 and the shape anisotropy of the free layers 54 in the MR elements 11 to 14 are set so that the strength of the component of the target magnetic field MFa in the direction parallel to the V direction can be detected. In FIG. 18, the thick arrows indicate the directions of the magnetization in the magnetization pinned layers 52. The X and V directions are shown in FIG. 18. As shown in FIG. 18, in the present embodiment, the directions of the magnetization of the magnetization pinned layers 52 in the MR elements 11 and 13 are the V direction. The directions of the magnetization of the magnetization pinned layers 52 in the MR elements 12 and 14 are the −V direction. The free layers 54 have shape anisotropy such that the direction of the easy axis of magnetization is parallel to the X direction.

As shown in FIG. 20, the target magnetic field MFa can be regarded as a composite magnetic field of a magnetic field MFay in a direction parallel to the Y direction and a magnetic field MFaz in a direction parallel to the Z direction. The MR elements 11 to 14 each detect a composite magnetic field of a component of the magnetic field MFay in a direction parallel to the V direction and a component of the magnetic field MFaz in the direction parallel to the V direction. A component in the direction parallel to the V direction will hereinafter be referred to as a V component. The composite magnetic field of the V component of the magnetic field MFay and the V component of the magnetic field MFaz will be referred to as a first composite magnetic field. The differential detector 21 outputs a signal having a correspondence with the strength of the first composite magnetic field as the detection signal S1.

The strength of the first composite magnetic field is equal to the sum of the strength of the V component of the magnetic field MFay and the strength of the V component of the magnetic field MFaz. Here, the strength of the magnetic field MFay will be denoted by the symbol By, and the strength of the magnetic field MFaz by the symbol Bz. The strength By is expressed in positive values when the direction of the magnetic field MFay is the Y direction, and in negative values when the direction of the magnetic field MFay is the −Y direction. The strength Bz is expressed in positive values when the direction of the magnetic field MFaz is the Z direction, and in negative values when the direction of the magnetic field MFaz is the −Z direction. The ratio of a change in the detection signal S1 to a change in the strength of the first composite magnetic field will be denoted by the symbol Sa. The detection signal S1 is expressed by the following Eq. (2):

$$S1 = Sa*(By*\cos\alpha - Bz*\sin\alpha) \qquad (2)$$

The strength of a V component is expressed in positive values when the direction of the V component is the V direction, and in negative values when the direction of the V component is the −V direction. The positive or negative sign of the strength of the V component of the magnetic field MFay coincides with that of the strength By of the magnetic field MFay. By contrast, the positive or negative sign of the strength of the V component of the magnetic field MFaz is opposite to that of the strength Bz of the magnetic field MFaz. In Eq. (2), the strength of the V component of the magnetic field MFay is therefore expressed as "By*cos α", and the strength of the V component of the magnetic field MFaz is expressed as "−Bz*sin α".

Assuming that the surfaces of the layers constituting the second MR elements 10B are flat surfaces, one direction parallel to the surfaces of the layers and orthogonal to the X direction will be referred to as a W direction. The direction opposite to the W direction will be referred to as a −W direction. Assuming that the surfaces of the layers are flat surfaces as described above, the second MR elements 10B are located on the second side portion SD2 in an orientation such that the surfaces of the layers are oblique to the XY plane. This makes the W direction different from the Y or −Y direction. In the present embodiment, the W direction is a direction rotated from the Y direction toward the Z direction by α.

Figure 21:
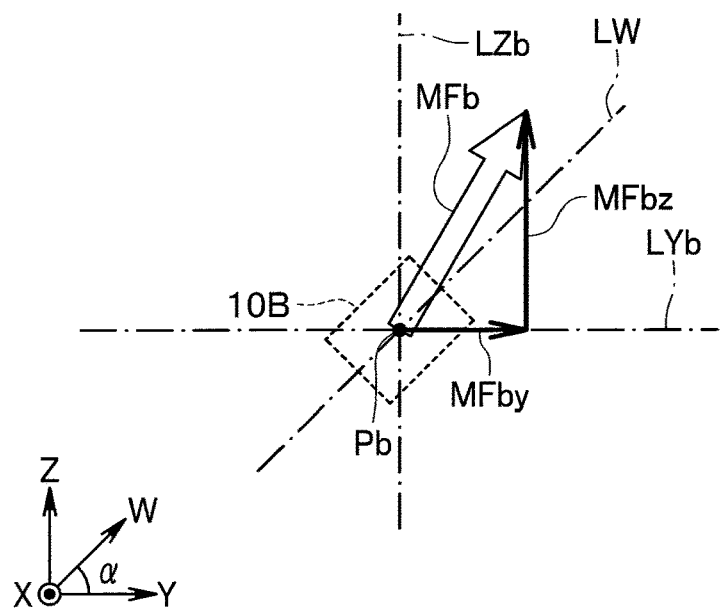
FIG. 21 is an explanatory diagram for describing a target magnetic field for a second magnetoresistive element according to the second embodiment of the present invention to detect.

FIG. 21 is an explanatory diagram for describing a target magnetic field MF for the second MR element 10B to detect. In FIG. 21, the position where the second MR element 10B detects the target magnetic field MF is denoted by the symbol Pb. In the present embodiment, the direction and strength of the target magnetic field MF at the position Pb coincide with those of the target magnetic field MF at the reference position on the rotation axis C. The direction of the target magnetic field MF at the position Pb rotates about the position Pb. The target magnetic field MF at the position Pb will hereinafter be denoted by the symbol MFb.

In FIG. 21, an imaginary straight line that passes the position Pb and is parallel to the Y direction will be denoted by the symbol LYb. An imaginary straight line that passes the position Pb and is parallel to the Z direction will be denoted by the symbol LZb. An imaginary straight line that passes the position Pb and is parallel to the W direction will be denoted by the symbol LW.

In the magnetic sensor 101, the directions of the magnetization of the magnetization pinned layers 52 in the MR elements 15 to 18 and the shape anisotropy of the free layers 54 in the MR elements 15 to 18 are set so that the strength of the component of the target magnetic field MFb in the direction parallel to the W direction can be detected. The X and W directions are shown in FIG. 18. For the sake of convenience, in FIG. 18, the W direction and the V direction are indicated by the same arrow. As shown in FIG. 18, in the present embodiment, the directions of the magnetization of the magnetization pinned layers 52 in the MR elements 15 and 17 are the W direction. The directions of the magnetization of the magnetization pinned layers 52 in the MR elements 16 and 18 are the −W direction. The free layer 54 has shape anisotropy such that the direction of the easy axis of magnetization is parallel to the X direction.

As shown in FIG. 21, the target magnetic field MFb can be regarded as a composite magnetic field of a magnetic field MFby in a direction parallel to the Y direction and a magnetic field MFbz in a direction parallel to the Z direction. The MR elements 15 to 18 each detect a composite magnetic field of a component of the magnetic field MFby in a direction parallel to the W direction and a component of the magnetic field MFbz in the direction parallel to the W direction. A component in the direction parallel to the W direction will hereinafter be referred to as a W component. The composite magnetic field of the W component of the magnetic field MFby and the W component of the magnetic field MFbz will be referred to as a second composite magnetic field. The differential detector 23 outputs a signal having a correspondence with the strength of the second composite magnetic field as the detection signal S2.

The strength of the second composite magnetic field is equal to the sum of the strength of the W component of the magnetic field MFby and the strength of the W component of the magnetic field MFbz. Both the strength of the target magnetic field MFb and the strength of the target magnetic field MFa are the same as that of the target magnetic field MF at the reference position. The strength of the magnetic field MFby is thus the same as that of the magnetic field MFay, and the strength of the magnetic field MFbz is the same as that of the magnetic field MFaz. Like the strength of the magnetic field MFay, the strength of the magnetic field MFby will therefore be denoted by the symbol By. Like the strength of the magnetic field MFaz, the strength of the magnetic field MFbz will be denoted by the symbol Bz. The ratio of a change in the detection signal S2 to a change in the strength of the second composite magnetic field will be denoted by the symbol Sb. The detection signal S2 is expressed by the following Eq. (3):

$$S2 = Sb*(By*\cos\alpha + Bz*\sin\alpha) \qquad (3)$$

The strength of the W component is expressed in positive values when the direction of the W component is the W direction, and in negative values when the direction of the W component is the −W direction. The positive or negative sign of the strength of the W component of the magnetic field MFby coincides with that of the strength By of the magnetic field MFby. The positive or negative sign of the strength of the W component of the magnetic field MFbz also coincides with that of the strength Bz of the magnetic field MFbz. In Eq. (3), the strength of the W component of the magnetic field MFby is therefore expressed as "By*cos α", and the strength of the W component of the magnetic field MFbz is expressed as "Bz*sin α".

In the present embodiment, the detection value generation circuit 22 generates the detection value Vs on the basis of the detection signals S1 and S2. The detection value generation circuit 22 may determine the angle that the direction of the target magnetic field MF at the reference position forms with respect to the Z direction as the detection value Vs. This angle is expressed in positive values when the direction of the target magnetic field MF tilts from the Z direction toward the Y direction, and in negative values when the direction of the target magnetic field MF tilts from the Z direction toward the -Y direction. In such a case, the detection value generation circuit 22 initially calculates values Bys and Bzs on the basis of the detection signals S1 and S2. The value Bys indicates the strength of the component of the target magnetic field MF in the direction parallel to the Y direction at the reference position. The value Bzs indicates the strength of the component of the target magnetic field MF in the direction parallel to the Z direction at the reference position.

The strength of the component of the target magnetic field MF in the Y direction at the reference position is the same as the strength By of the magnetic field MFay or MFby. Suppose that the ratio Sa of a change in the detection signal S1 to a change in the strength of the first composite magnetic field and the ratio Sb of a change in the detection signal S2 to a change in the strength of the second composite magnetic field are the same. By replacing both Sa in Eq. (2) and Sb in Eq. (3) with Sc, Eqs. (2) and (3) yield the strength By expressed by the following Eq. (4):

$$By=(S2+S1)/(2Sc^*\cos \alpha) \quad (4)$$

For example, the detection value generation circuit 22 calculates the value Bys by using the right-hand side of Eq. (4). Sc is determined in advance.

The strength of the component of the target magnetic field MF in the Z direction at the reference position is the same as the strength Bz of the magnetic field MFaz or MFbz. Like Eq. (4), by replacing Sa in Eq. (2) and Sb in Eq. (3) with Sc, Eqs. (2) and (3) yield the strength Bz expressed by the following Eq. (5):

$$Bz=(S2-S1)/(2Sc^*\sin \alpha) \quad (5)$$

For example, the detection value generation circuit 22 calculates the value Bzs by using the right-hand side of Eq. (5).

The detection value generation circuit 22 then determines the angle that the direction of the target magnetic field MF forms with respect to the Z direction as the detection value Vs by using the values Bys and Bzs. Specifically, for example, the detection value generation circuit 22 generates the detection value Vs by the following Eq. (6):

$$Vs=90°-\text{atan}(Bzs/Bys)=90°-\theta s \quad (6)$$

"atan" represents arctangent.

For θs ranging from 0° to less than 360°, Eq. (6) yields two solutions of θs that are 1800 different in value. Which of the two solutions of θs in Eq. (6) is the true value of θs can be determined in accordance with the combination of the signs of Bys and Bzs. The detection value generation circuit 22 determines θs within the range of 0° to less than 3600 in accordance with Eq. (6) and the determination on the combination of the signs of Bys and Byz.

The configuration, operation and effects of the present embodiment are otherwise the same as those of the first embodiment.

The present invention is not limited to the foregoing embodiments, and various modification examples may be made thereto. The shape and layout of the at least one conductor portion of coil 30 are not limited to the examples described in the foregoing embodiments, and may be freely determined as long as the requirements set forth in the claims are satisfied. For example, a conductor portion located on the bottom surface 40b side of the support member 40 may extend along an imaginary curve curving to protrude in a direction away from the corresponding MR element.

The top surface 40a of the support member 40 may include a plurality of curved surface portions. The plurality of curved surface portions each have the same shape as that of the curved surface portion 40a1. The plurality of curved surface portions may be arranged so as to be aligned in the Y direction. In such a case, the MR elements may be located on the respective plurality of curved surface portions.

The detection value generation circuit 22 of the magnetic sensor 1 according to the first embodiment may generate a value indicating the strength of a component of the target magnetic field MF in a direction parallel to the Z direction as the detection value Vs. The detection value generation circuit 22 of the magnetic sensor 1 according to the first embodiment may generate a set of values Bys and Bzs as the detection value Vs.

Obviously, many modification examples and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A magnetic sensor comprising:
   a magnetoresistive element whose resistance changes with an external magnetic field;
   an insulating layer;
   a coil that generates a coil magnetic field, the coil magnetic field being a magnetic field to be applied to the magnetoresistive element, the coil including a conductor portion located on the insulating layer; and
   a support member that supports the magnetoresistive element, the support member including a top surface opposed to the magnetoresistive element and a bottom surface located on a side opposite to the top surface, wherein
   the coil is formed above the top surface of the support member, and the conductor portion is a curved portion that protrudes in a direction away from the magnetoresistive element and the bottom surface of the support member.

2. The magnetic sensor according to claim 1, wherein the insulating layer is located between the conductor portion and the support member.

3. The magnetic sensor according to claim 2, wherein the insulating layer is filled up between the conductor portion and the support member.

4. The magnetic sensor according to claim 1, wherein the insulating layer is located between the conductor portion and the magnetoresistive element.

5. The magnetic sensor according to claim 4, wherein the insulating layer is filled up between the conductor portion and the magnetoresistive element.

6. The magnetic sensor according to claim 1, wherein the support member includes a through hole through which the coil passes.

7. The magnetic sensor according to claim 1, wherein the insulating layer includes a top surface including a periodic curved surface portion curving periodically.

8. A magnetic sensor comprising:
a first magnetoresistive element whose resistance changes with an external magnetic field;
a coil that generates a coil magnetic field, the coil magnetic field being a magnetic field to be applied to the first magnetoresistive element;
a support member including a top surface and a bottom surface located on a side opposite to the top surface, wherein:
the top surface of the support member includes a curved surface portion curving to protrude in a direction away from the bottom surface of the support member;
the curved surface portion of the top surface of the support member includes a center portion that extends along a first direction and is located at a center of the curved surface portion in a second direction orthogonal to the first direction, and a first side portion and a second side portion that are located on both sides of the center portion in the second direction;
the first side portion and the second side portion are two curved slopes that are located at positions closer to the bottom surface of the support member than the center portion is, and a distance between which increases toward the bottom surface of the support member; and
the first magnetoresistive element is located on the first side portion.

9. The magnetic sensor according to claim 8, further comprising a second magnetoresistive element located on the second side portion.

10. The magnetic sensor according to claim 9, wherein:
the first magnetoresistive element is configured to detect a magnetic field including a component in a direction parallel to a direction tilted with respect to the bottom surface of the support member; and
the second magnetoresistive element is configured to detect a magnetic field including a component in a direction parallel to another direction tilted with respect to the bottom surface of the support member.

11. The magnetic sensor according to claim 8, wherein:
the top surface of the support member further includes a flat surface portion located at a position closer to the bottom surface of the support member than the curved surface portion is;
the coil includes a top end portion farthest from the top surface of the support member; and
an interval between the center portion and the top end portion in the second direction is smaller than an interval between the flat surface portion and the top end portion in the second direction in a cross section orthogonal to the first direction and intersecting the first magnetoresistive element.

12. A magnetic sensor comprising:
a first magnetoresistive element configured to detect a magnetic field including a component in a first direction;
a second magnetoresistive element configured to detect a magnetic field including a component in a second direction; and
a coil that generates a coil magnetic field, the coil magnetic field being a magnetic field to be applied to the first and second magnetoresistive elements, wherein:
each of the first and second magnetoresistive elements includes a magnetization pinned layer having first magnetization whose direction is fixed and a free layer having second magnetization whose direction is changeable with the external magnetic field; and
the coil includes a conductor portion, the conductor portion extending in a third direction, the third direction being a direction intersecting each of a direction of the second magnetization of the free layer of the first magnetoresistive element when a strength of the component in the first direction of the magnetic field to be applied to the first magnetoresistive element is 0, and a direction of the second magnetization of the free layer of the second magnetoresistive element when a strength of the component in the second direction of the magnetic field to be applied to the second magnetoresistive element is 0.

13. The magnetic sensor according to claim 12, wherein the second direction is a direction intersecting the first direction.

14. The magnetic sensor according to claim 12, further comprising a support member that supports the first and second magnetoresistive elements, the support member including a top surface opposed to the first and second magnetoresistive elements and a bottom surface located on a side opposite to the top surface,
wherein the first direction and the second direction are each a direction tilted with respect to the bottom surface of the support member.

15. The magnetic sensor according to claim 1, wherein the coil is formed on the top surface of the support member.

* * * * *